(12) United States Patent
Asada

(10) Patent No.: US 7,919,822 B2
(45) Date of Patent: Apr. 5, 2011

(54) SEMICONDUCTOR DEVICE AND METHOD FOR FABRICATING THE SAME

(75) Inventor: Hitoshi Asada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 274 days.

(21) Appl. No.: 11/372,374

(22) Filed: Mar. 10, 2006

(65) Prior Publication Data

US 2007/0052038 A1 Mar. 8, 2007

(30) Foreign Application Priority Data

Sep. 2, 2005 (JP) .................................. 2005-254729

(51) Int. Cl.
*H01L 21/02* (2006.01)

(52) U.S. Cl. ........ 257/389; 257/381; 257/382; 257/491; 257/E29.13

(58) Field of Classification Search .................. 257/381, 257/382, 383, 384, 491, 389, E29.13
See application file for complete search history.

(56) References Cited

U.S. PATENT DOCUMENTS

| 5,286,664 | A  | * | 2/1994 | Horiuchi ....................... 438/286 |
| 6,770,522 | B2 | * | 8/2004 | Okumura et al. ............. 438/199 |
| 2004/0014294 | A1 | | 1/2004 | Park et al. |
| 2004/0155297 | A1 | | 8/2004 | Ariyoshi et al. |

FOREIGN PATENT DOCUMENTS

| JP | 8-064688 | 3/1996 |
| JP | 9-097898 | 4/1997 |
| JP | 2001-308194 A | 11/2001 |
| JP | 2002-252346 A | 9/2002 |
| JP | 2004-056069 A | 2/2004 |
| JP | 2004-079888 A | 3/2004 |
| JP | 2004-111746 | 4/2004 |
| JP | 2005-064190 A | 3/2005 |

OTHER PUBLICATIONS

Japan Patent Office: Japanese Office Action mailed Nov. 16, 2010 in corresponding JP Patent Application No. 2005-254729, with partial English-language translation.
Japan Patent Office: Japanese Office Action mailed Jun. 8, 2010, in corresponding JP Patent Application No. 2005-0254729, with partial English-language translation (previously submitted along with certified IDS filed on Sep. 8, 2010 but misidentified therein).

* cited by examiner

*Primary Examiner* — Tan N Tran
(74) *Attorney, Agent, or Firm* — Fujitsu Patent Center

(57) ABSTRACT

A semiconductor device that suppresses variation and a drop in the breakdown voltage of transistors. In the semiconductor device in which a logic transistor and a high-breakdown-voltage transistor are formed on one Si substrate, an insulating film which has an opening region and which is thick around the opening region is formed on a low concentration drain region formed in the Si substrate on one side of a gate electrode of the high-breakdown-voltage transistor. The insulating film around the opening region has a two-layer structure including a gate insulating film and a sidewall insulating film. When ion implantation is performed on the low concentration drain region beneath the opening region to form a high concentration drain region, the insulating film around the opening region prevents impurities from passing through. This eliminates variation in the relative positions of the opening region and a place where the high concentration drain region is formed, and the high concentration drain region can be formed on a self align basis with respect to the low concentration drain region.

5 Claims, 34 Drawing Sheets

SEMICONDUCTOR DEVICE AND METHOD FOR FABRICATING THE SAME

CROSS-REFERENCE TO RELATED APPLICATIONS

This application is based upon and claims the benefits of priority from the prior Japanese Patent Application No. 2005-254729, filed on Sep. 2, 2005, the entire contents of which are incorporated herein by reference.

BACKGROUND OF THE INVENTION (1) Field of the Invention

This invention relates to a semiconductor device and a method for fabricating such a semiconductor device and, more particularly, to a semiconductor device in which plural kinds of transistors are formed on one substrate and a method for fabricating such a semiconductor device.

(2) Description of the Related Art

To increase the operating speeds of high-breakdown-voltage transistors used in organic electroluminescence (EL) panels, liquid crystal display (LCD) drivers, ink jet printers, and the like, in recent years there have been intense demands for the formation of such high-breakdown-voltage transistors and logic transistors to be fabricated especially on the basis of the process rule of 0.35 μm or less on one substrate.

At present, a salicide process is usually adopted for forming 0.35-micrometer-or-less logic transistors in order to form shallow junctions in their source and drain regions or reduce contact resistance. If logic transistors formed with high-breakdown-voltage transistors on one substrate must operate at high speeds, such salicide is indispensably formed. In a salicide process usually adopted, salicide is also formed on at least contact regions, such as a source region and a drain region, in each of the high-breakdown-voltage transistors formed with the logic transistors on the one substrate. With salicide formed in a high-breakdown-voltage transistor, contact resistance can be reduced, but breakdown voltage may drop depending on, for example, where the salicide is formed.

A semiconductor device for securing a sufficiently high breakdown voltage even in the case of salicide being formed has conventionally been proposed (see Japanese Patent Laid-Open Publication No. 2004-111746). In Japanese Patent Laid-Open Publication No. 2004-111746, if high-breakdown-voltage transistors and logic transistors, for example, are formed on one substrate, a high impurity concentration region is formed in a low impurity concentration region but its periphery in a drain region between a gate electrode and an isolation region of each high-breakdown-voltage transistor where a high voltage is applied at a distance from the isolation region. Salicide is then formed on the high impurity concentration region but its periphery. By forming the salicide, contact resistance can be reduced. In addition, by forming the high impurity concentration region inside the low impurity concentration region, electric field concentration which occurs at the time of voltage being applied to a drain is lessened and a sufficiently high breakdown voltage is secured.

By the way, if a semiconductor device in which logic transistors and high-breakdown-voltage transistors are formed on one substrate is fabricated, the following problems may arise when a sidewall is formed on the sides of a gate electrode of each logic transistor.

FIG. 32 is a schematic sectional view showing an important part of an example of a sidewall formation process.

As shown in FIG. 32, the case where an n-channel logic transistor, a p-channel logic transistor, an n-channel high-breakdown-voltage transistor, and a p-channel high-breakdown-voltage transistor are formed on a silicon (Si) substrate 200 is taken as an example. A logic transistor section 210 where an n-channel logic transistor is formed, a logic transistor section 220 where a p-channel logic transistor is formed, a high-breakdown-voltage transistor section 230 where an n-channel high-breakdown-voltage transistor is formed, and a high-breakdown-voltage transistor section 240 where a p-channel high-breakdown-voltage transistor is formed are defined by isolation regions 201a and 201b, the isolation region 201b and an isolation region 201c, the isolation region 201c and an isolation region 201d, and the isolation region 201d and an isolation region 201e, respectively.

In the logic transistor section 210 where an n-channel logic transistor is formed, a channel doped region 212 for adjusting threshold voltage is formed in a p-type well region 211. A gate electrode 214 is formed over the channel doped region 212 with a gate insulating film 213 between. The gate electrode 214 is made up of three layers, that is to say, of a polycrystalline silicon layer 214a, a silicide layer 214b, and a cap film 214c. A low concentration source region 215 and low concentration drain region 216 which are doped with n-type impurities are formed in the Si substrate 200 on both sides of the gate electrode 214.

The structure of the logic transistor section 220 where a p-channel logic transistor is formed is the same as that of the logic transistor section 210. A channel doped region 222 is formed in an n-type well region 221. A gate electrode 224 made up of a polycrystalline silicon layer 224a, a silicide layer 224b, and a cap film 224c is formed over the channel doped region 222 with a gate insulating film 223 between. A low concentration source region 225 and low concentration drain region 226 which are doped with p-type impurities are formed in the Si substrate 200 on both sides of the gate electrode 224.

In the high-breakdown-voltage transistor section 230 where an n-channel high-breakdown-voltage transistor is formed, on the other hand, a gate electrode 234 made up of a polycrystalline silicon layer 234a, a silicide layer 234b, and a cap film 234c is formed over a channel doped region 232 formed in the Si substrate 200 with a gate insulating film 233 between. The gate insulating film 233 is thicker than the gate insulating films 213 and 223 formed in the logic transistor sections 210 and 220 respectively. A low concentration source region 235 and low concentration drain region 236 which are doped with n-type impurities are formed in the Si substrate 200 on both sides of the gate electrode 234. Channel stop regions 237 and 238 doped with p-type impurities are formed near the isolation regions 201c and 201d respectively.

The structure of the high-breakdown-voltage transistor section 240 where a p-channel high-breakdown-voltage transistor is formed is the same as that of the high-breakdown-voltage transistor section 230. A channel doped region 242 is formed in an n-type well region 241. A gate electrode 244 made up of a polycrystalline silicon layer 244a, a silicide layer 244b, and a cap film 244c is formed over the channel doped region 242 with a gate insulating film 243 between. The gate insulating film 243 is thicker than the gate insulating films 213 and 223. A low concentration source region 245 and low concentration drain region 246 which are doped with p-type impurities are formed in the Si substrate 200 on both sides of the gate electrode 244. Channel stop regions 247 and 248 doped with p-type impurities are formed near the isolation regions 201d and 201e respectively.

As shown in FIG. 32, for example, the following way is used for forming sidewalls in the logic transistor sections 210 and 220. An insulating film (sidewall insulating film) 202 made of, for example, silicon oxide ($SiO_2$) is formed on the entire surface of the above structure, the high-breakdown-voltage transistor sections 230 and 240 are covered with a resist film 203, and etching is performed. As a result, the sidewall insulating film 202 remains on the sides of the gate electrodes 214 and 224 and sidewalls are formed. The sidewalls formed in the logic transistor sections 210 and 220, together with the gate electrodes 214 and 224, are then used as masks when ion implantation is performed for forming high concentration source regions in the low concentration source regions 215 and 225 and forming high concentration drain regions in the low concentration drain regions 216 and 226.

However, if the above way is used for forming the sidewalls in the logic transistor sections 210 and 220, the shape of the sidewalls depends on the area of the resist film 203 which covers the high-breakdown-voltage transistor sections 230 and 240. To be concrete, there are many cases where if the area of the resist film 203 which covers the high-breakdown-voltage transistor sections 230 and 240 is large, the sidewalls formed in the logic transistor sections 210 and 220 spread wide. At present, it is known that if the method of forming the resist film 203 which covers the high-breakdown-voltage transistor sections 230 and 240 at the time of forming the sidewalls in the logic transistor sections 210 and 220 is adopted and the area of the high-breakdown-voltage transistor sections 230 and 240 exceeds a certain value with respect to the area of a chip, there is a strong possibility that a drop in current occurs in logic transistors finally formed due to a change in the shape of the sidewalls.

However, this problem can be avoided by forming the sidewall insulating film 202 on an entire surface and by etching the entire surface without forming the resist film 203 over the high-breakdown-voltage transistor sections 230 and 240.

FIG. 33 is a schematic sectional view showing an important part of another example of a sidewall formation process. FIG. 33 is a schematic sectional view showing a state obtained by etching the entire surface without forming the resist film 203 shown in FIG. 32. Components in FIG. 33 that are the same as those shown in FIG. 32 are marked with the same symbols and detailed descriptions of them will be omitted.

As shown in FIG. 33, it is possible to form sidewalls 217, 227, 237, and 247 in logic transistor sections 210 and 220 and high-breakdown-voltage transistor sections 230 and 240, respectively, by etching a sidewall insulating film without forming a resist film. In this case, an Si substrate 200 (low concentration source regions 215 and 225 and low concentration drain regions 216 and 226) gets exposed in the logic transistor sections 210 and 220 except under gate electrodes 214 and 224 and the sidewalls 217 and 227. However, thick gate insulating films 233 and 243 are originally formed in the high-breakdown-voltage transistor sections 230 and 240 respectively. Accordingly, the gate insulating films 233 and 243 remain on the Si substrate 200.

With this method, a resist is not used for forming the sidewalls 217 and 227 in the logic transistor sections 210 and 220 respectively. As a result, it is possible to form the sidewalls 217 and 227 each having a proper shape without taking the above influence of the resist film 203 into consideration. This prevents a deterioration in the characteristics of logic transistors.

However, if the sidewalls 217, 227, 237, and 247 are formed in this way, a problem arises in a later process for forming high concentration source and drain regions or salicide.

FIG. 34 is a schematic sectional view showing an important part of an example of a high impurity concentration region formation process. Components in FIG. 34 that are the same as those shown in FIG. 32 or 33 are marked with the same symbols and detailed descriptions of them will be omitted.

As stated above, if a sidewall insulating film is etched without forming a resist film, gate insulating films 233 and 243 remain on an Si substrate 200 (low concentration source regions 235 and 245 and low concentration drain regions 236 and 246) in high-breakdown-voltage transistor sections 230 and 240. Usually opening regions 204a, 204b, 204c, and 204d are then formed in the gate insulating film 233 on the low concentration source region 235 in the high-breakdown-voltage transistor section 230, in the gate insulating film 243 on the low concentration source region 245 in the high-breakdown-voltage transistor section 240, in the gate insulating film 233 on the low concentration drain region 236 in the high-breakdown-voltage transistor section 230, and in the gate insulating film 243 on the low concentration drain region 246 in the high-breakdown-voltage transistor section 240, respectively. Ions are implanted from the opening regions 204a, 204b, 204c, and 204d.

In this case, it is preferable from the viewpoint of securing breakdown voltage that edges of high concentration drain regions formed in the drain regions in the high-breakdown-voltage transistor sections 230 and 240 should be separate from an edge on the gate electrode 234 or 244 side or on the isolation region 201d or 201e side of the low concentration drain region 236 or 246. Accordingly, the opening regions 204c and 204d on the drain regions in the high-breakdown-voltage transistor sections 230 and 240 should be formed so that the gate insulating films 233 and 243 will be left inside by predetermined distance from the edges on the gate electrode 234 and 244 sides and on the isolation region 201d and 201e sides of the low concentration drain regions 236 and 246. By leaving the gate insulating films 233 and 243 on the drain regions in this way, silicide is formed only in the opening regions 204c and 204d and the other regions function as a mask (silicide block) for blocking the formation of silicide in a silicide process performed after the ion implantation for forming high concentration source and drain regions.

As shown in FIG. 34, after the opening regions 204a, 204b, 204c, and 204d are formed, a p-channel logic transistor section 220 and the high-breakdown-voltage transistor section 240 are covered with a resist film 205 and the gate electrode 234 in the n-channel high-breakdown-voltage transistor section 230 is covered with the resist film 205. In this case, edges of the resist film 205 should be on the gate electrode 234 and the isolation region 201d sides from edges of the opening region 204c in the n-channel high-breakdown-voltage transistor section 230 with, for example, a positional deviation at the time of forming the resist film 205 taken into consideration so that the resist film 205 will not be formed in the opening region 204c on the drain region. In this state, ion implantation is performed to form the high concentration source and drain regions in an n-channel logic transistor sections 210 and the high-breakdown-voltage transistor section 230. Ion implantation for forming the high concentration source and drain regions in the p-channel logic transistor section 220 and the high-breakdown-voltage transistor section 240 is performed in the same way.

However, when the above ion implantation is performed, the number of impurities which pierce through the gate insulating films 233 and 243, that is to say, the number of impurities which are introduced into the Si substrate 200 may depend on the remaining thickness of the gate insulating films 233 and 243 or the area of exposed portions not covered with the resist film 205 in the opening regions 204c and 204d on the drain regions in the high-breakdown-voltage transistor sections 230 and 240. As a result, positions where the high concentration source and drain regions are formed may deviate from target places to the gate electrode 234 or 244 side or the isolation region 201d or 201e side.

In other words, if ion implantation regions for forming the high concentration source and drain regions are defined by a resist film, the ion implantation regions, that is to say, the positions where the high concentration source and drain regions are formed may depend on positions where the resist film is formed. This leads to variation or a drop in the breakdown voltage of high-breakdown-voltage transistors finally formed.

The semiconductor device in which two or more kinds of transistors (logic transistors and high-breakdown-voltage transistors, in the above example) are formed on one substrate has been described as an example. However, the above problem of variation or a drop in breakdown voltage may arise not only in semiconductor devices in which two or more kinds of transistors are formed on one substrate but also in semiconductor devices which are fabricated by forming silicide blocks on low impurity concentration regions with, for example, an insulating film and by forming high impurity concentration regions beneath opening regions by ion implantation.

SUMMARY OF THE INVENTION

The present invention was made under the background circumstances described above. An object of the present invention is to provide a high-performance high-quality semiconductor device the characteristics of which are superior and variation in the characteristics of which is suppressed.

Another object of the present invention is to provide a method for fabricating a high-performance high-quality semiconductor device the characteristics of which are superior and variation in the characteristics of which is suppressed.

In order to achieve the above-mentioned first object, a semiconductor device having a source region including a low impurity concentration region and a high impurity concentration region and a drain region including a low impurity concentration region and a high impurity concentration region is provided. This semiconductor device comprises a gate electrode formed over a semiconductor substrate with a gate insulating film between; the low impurity concentration regions formed in the semiconductor substrate on both sides of the gate electrode; an insulating film which is formed on at least one of the low impurity concentration regions, which has an opening region, and which is thick around the opening region; and a high impurity concentration region formed in a low impurity concentration region beneath the opening region.

In order to achieve the above-mentioned second object, a method for fabricating a semiconductor device having a source region and a drain region each including a low impurity concentration region and a high impurity concentration region is provided. This method comprises the processes of forming a gate electrode over a semiconductor substrate with a gate insulating film between; forming the low impurity concentration regions in the semiconductor substrate on both sides of the gate electrode; forming an insulating film which has an opening region and which is thick around the opening region on at least one of the low impurity concentration regions; and forming a high impurity concentration region in the low impurity concentration region beneath the opening region.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

An embodiment of the present invention will now be described in detail with reference to the drawings. A semiconductor device in which a logic transistor and a high-breakdown-voltage transistor are formed on one semiconductor substrate will be taken as an example.

Figure 1:
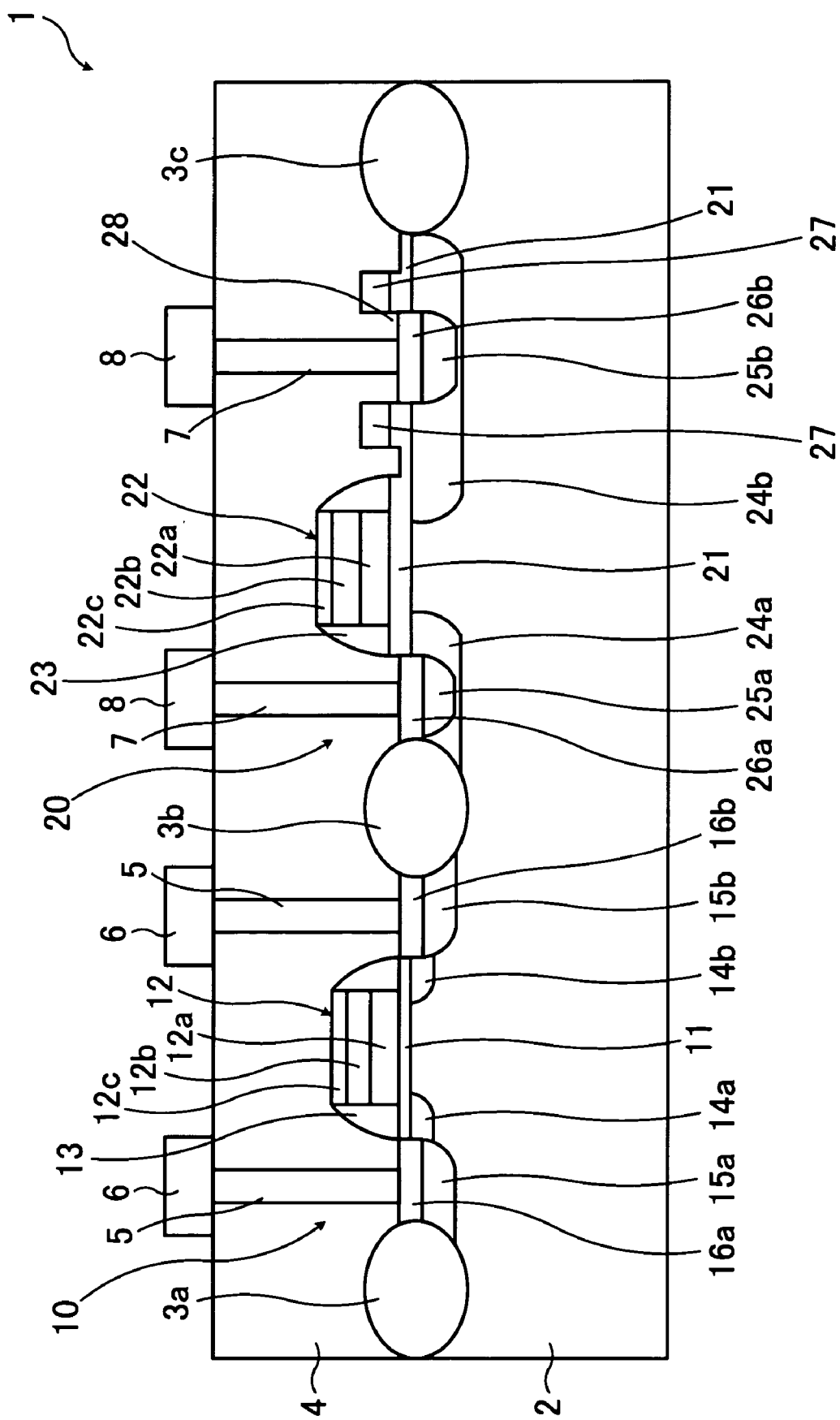
FIG. 1 shows an example of the structure of a semiconductor device.
Figure 2A:
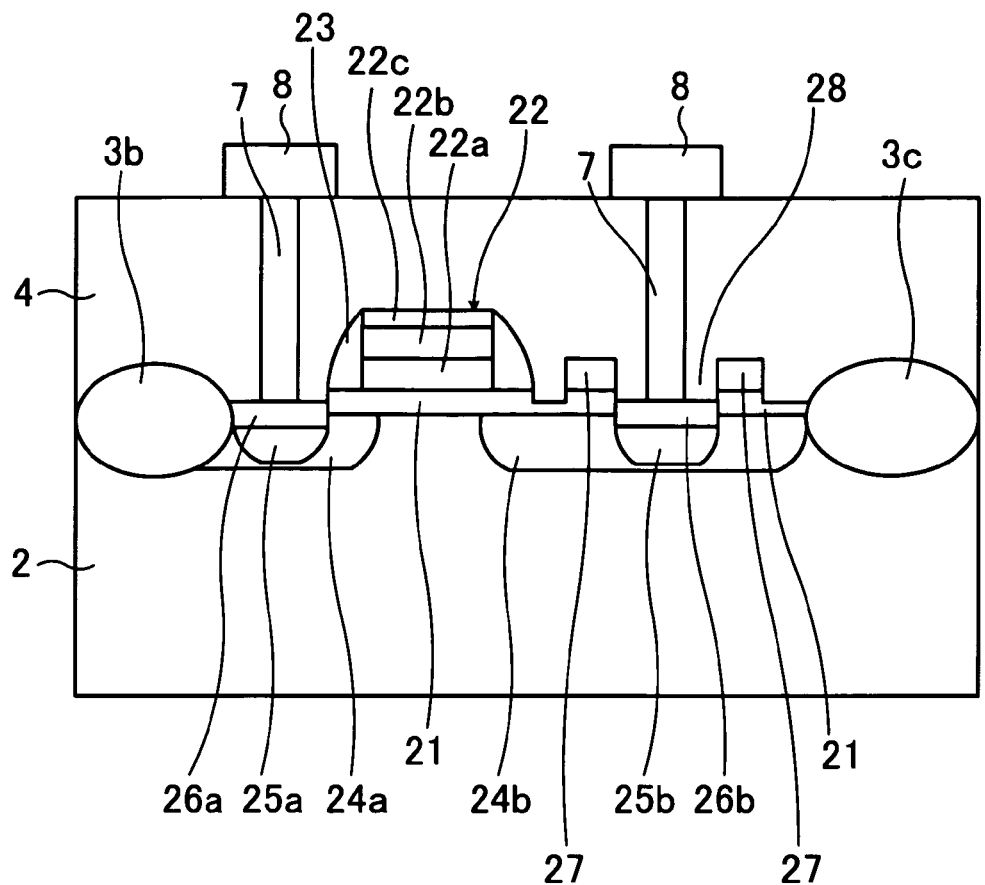
FIGS. 2(A) and 2(B) show an example of the structure of a high-breakdown-voltage transistor included in the semiconductor device, FIG. 2A being a schematic sectional view showing an important part of the high-breakdown-voltage transistor, FIG. 2B being a schematic plan view showing the important part of the high-breakdown-voltage transistor.
Figure 2B:
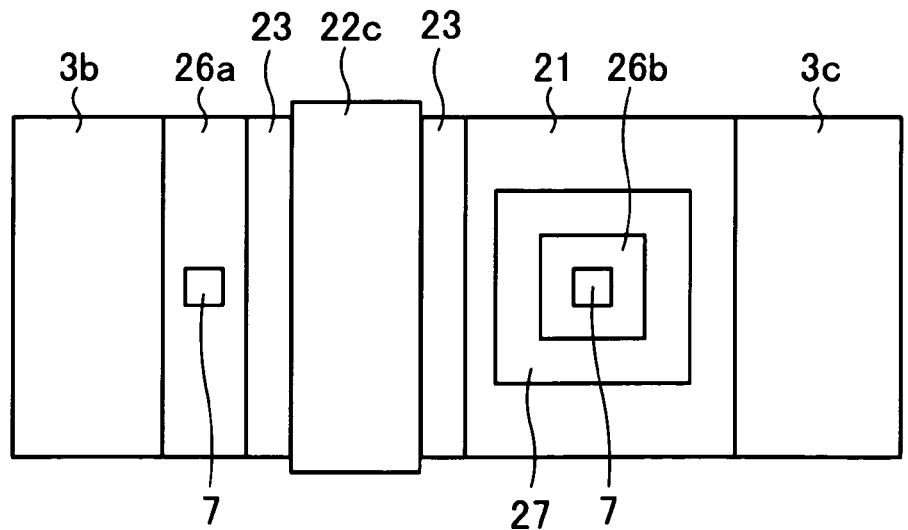

FIG. 1 shows an example of the structure of a semiconductor device. FIGS. 2(A) and 2(B) show an example of the structure of a high-breakdown-voltage transistor included in the semiconductor device. FIG. 2A is a schematic sectional view showing an important part of the high-breakdown-voltage transistor. FIG. 2B is a schematic plan view showing the important part of the high-breakdown-voltage transistor. Components in FIGS. 2A and 2B that are the same as those shown in FIG. 1 are marked with the same symbols. However, wirings 6 and 8 and an interlayer dielectric film 4 described later are not shown in FIG. 2B.

In a semiconductor device 1 shown in FIG. 1, a logic transistor 10 and a high-breakdown-voltage transistor 20 are formed on a common Si substrate 2. An element region of the logic transistor 10 is defined by isolation regions 3a and 3b and an element region of the high-breakdown-voltage transistor 20 is defined by the isolation region 3b and an isolation region 3c.

The logic transistor 10 includes a gate electrode 12 formed over the Si substrate 2 with a gate insulating film 11 between. The gate electrode 12 is made up of three layers, that is to say, of a polycrystalline silicon layer 12a, a silicide layer 12b, and a cap film 12c. A sidewall 13 is formed on the sides of the gate electrode 12. The silicide layer 12b in the gate electrode 12 is made of, for example, tungsten (W) silicide. The cap film 12c is made of an $SiO_2$ film, a silicon nitride (SiN) film, or the like. The sidewall 13 is made of an $SiO_2$ film, an SiN film, or the like.

A low concentration source region 14a and a low concentration drain region 14b are formed in the Si substrate 2 under the sidewall 13. A high concentration source region 15a and a high concentration drain region 15b are formed in the Si substrate 2 on both sides of the sidewall 13. Silicide layers 16a and 16b are formed on the entire surfaces of the high concentration source region 15a and the high concentration drain region 15b respectively. Plugs 5 which are made of, for example, tungsten (W) and which pierce the interlayer dielectric film 4 made of, for example, an $SiO_2$ film are connected to the silicide layers 16a and 16b. The other end of each plug 5 is connected to the wiring 6 which is made of, for example, aluminum (Al) and which is located on the interlayer dielectric film 4.

The high-breakdown-voltage transistor 20 includes a gate electrode 22 formed over the Si substrate 2 with a gate insulating film 21 between. The gate insulating film 21 is thicker than the gate insulating film 11 in the logic transistor 10. The gate electrode 22 is made up of three layers, that is to say, of a polycrystalline silicon layer 22a, a silicide layer 22b made of tungsten (W) silicide or the like, and a cap film 22c made of an $SiO_2$ film or the like. A sidewall 23 made of an $SiO_2$ film or the like is formed on the sides of the gate electrode 22.

A low concentration source region 24a and a low concentration drain region 24b are formed in the Si substrate 2 on both sides of the gate electrode 22. A high concentration source region 25a and a high concentration drain region 25b are formed so that they will be involved in the low concentration source region 24a and the low concentration drain region 24b respectively. Silicide layers 26a and 26b are formed on the high concentration source region 25a and the high concentration drain region 25b respectively. Plugs 7 which are made of, for example, tungsten (W) and which pierce the interlayer dielectric film 4 made of, for example, an $SiO_2$ film are connected to the silicide layers 26a and 26b. The other end of each plug 7 is connected to the wiring 8 which is made of, for example, aluminum (Al) and which is located on the interlayer dielectric film 4.

As shown in FIGS. 1, 2(A), and 2(B), a sidewall insulating film 27 which is made of, for example, an $SiO_2$ film and which is used for forming the gate insulating film 21 and the sidewall 23 is partially left over the drain region in the high-breakdown-voltage transistor 20.

The gate insulating film 21 and the sidewall insulating film 27 form a two-layer structure around the silicide layer 26b. The film thickness of this two-layer structure is more than the film thickness of the other portions on the drain region.

In the semiconductor device 1, the gate insulating film 21 and the sidewall insulating film 27 partially left on the drain region in the high-breakdown-voltage transistor 20 function as a silicide block for preventing the Si substrate 2 from changing into silicide in a silicide process. Moreover, ion implantation is performed prior to the silicide process to form the high concentration drain region 25b. Even if this ion implantation is performed on the two-layer structure including the gate insulating film 21 and the sidewall insulating film 27, the two-layer structure effectively suppresses the piercing of impurities.

That is to say, when the semiconductor device 1 is fabricated, an opening region 28 enclosed by the two-layer structure including the gate insulating film 21 and the sidewall insulating film 27 is formed on the low concentration drain region 24b, a resist film is formed on a proper region other than the opening region 28, and ion implantation is performed on the Si substrate 2. By doing so, the high concentration drain region 25b can be formed at a place which is separate from the edges of the isolation region 3c and the gate electrode 22. In addition, even if a resist film is not formed on the two-layer structure including the gate insulating film 21 and the sidewall insulating film 27 at the time of the ion implantation, the two-layer structure prevents impurities from piercing. Accordingly, impurities can selectively be introduced into the opening region 28. In other words, the above opening region 28 exists, so it may safely be said that the high concentration drain region 25b is formed on a self align basis with respect to the low concentration drain region 24b.

The surface of the Si substrate 2 which gets exposed in the opening region 28 is changed into silicide to form the silicide layer 26b on the drain region in the high-breakdown-voltage transistor 20. Accordingly, the silicide layer 26b can also be formed at a place which is separate from the edges of the isolation region 3c and the gate electrode 22. That is to say, the silicide layer 26b is formed on the high concentration drain region 25b formed prior to its formation. Therefore, it may safely be said that the silicide layer 26b is formed on a self align basis with respect to the low concentration drain region 24b. This is the same with the high concentration drain region 25b.

The opening region 28 in the semiconductor device having the above structure can be formed in, for example, the following way.

Figure 3:
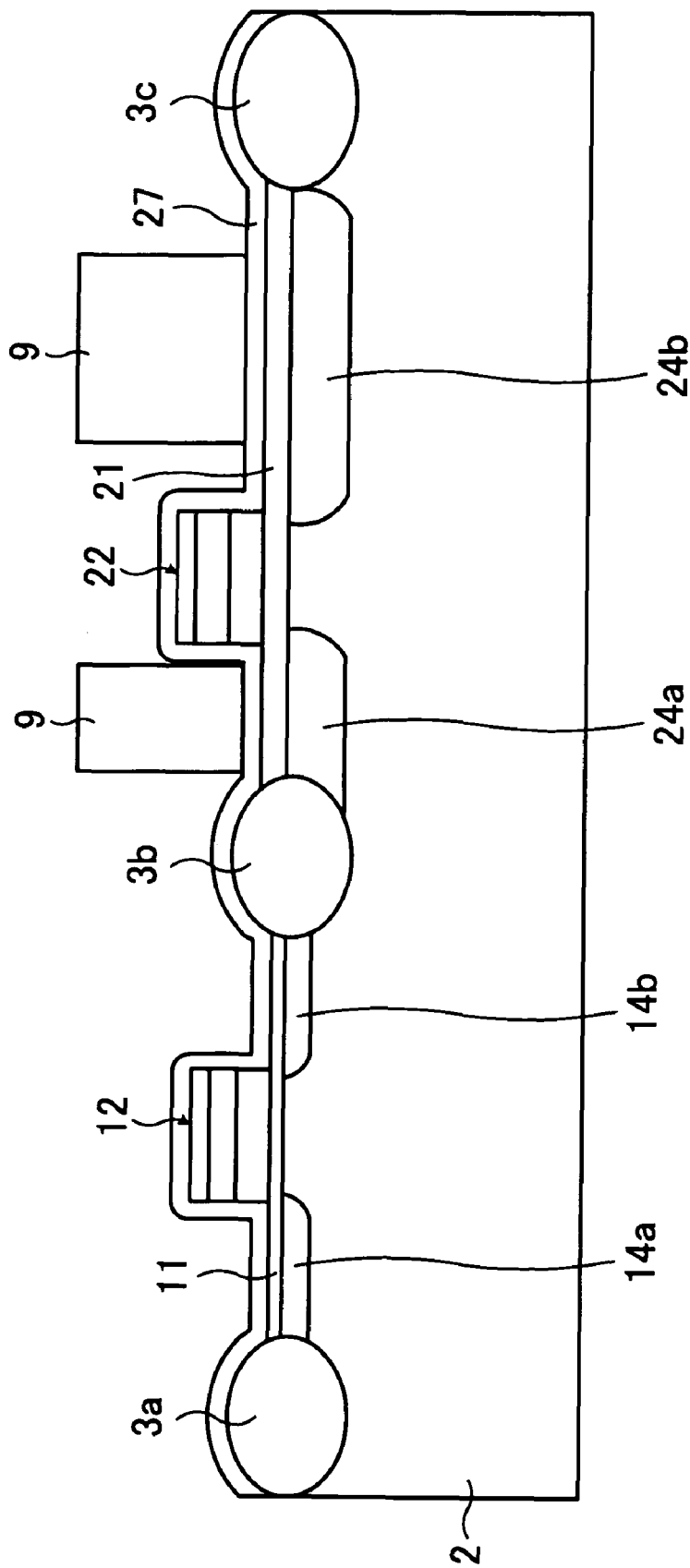
FIG. 3 is a view for describing how to form an opening region.

FIG. 3 is a view for describing how to form the opening region.

First, the isolation regions 3a, 3b, and 3c, the gate insulating films 11 and 21, and the gate electrodes 12 and 22 are formed on the Si substrate 2. In the region where the logic transistor 10 is to be formed, ion implantation is performed with the gate electrode 12 as a mask to form the low concentration source region 14a and the low concentration drain region 14b. In the region where the high-breakdown-voltage transistor 20 is to be formed, ion implantation is performed with the gate electrode 22 as a mask to form the low concentration source region 24a and the low concentration drain region 24b. An $SiO_2$ film or the like is then formed on an entire surface by, for example, a chemical vapor deposition (CVD) method. As a result, the sidewall insulating film 27 is formed.

Next, to form the sidewall 13 of the logic transistor 10 and the silicide block of the high-breakdown-voltage transistor 20, patterning is performed by using a resist film 9. In this case, the resist film 9 is not formed on the region where the logic transistor 10 is to be formed, and is formed only on the region where the high-breakdown-voltage transistor 20 is to be formed. On the region where the high-breakdown-voltage transistor 20 is to be formed, the resist film 9 of the smallest size by which the opening region 28 can be formed in a later process and by which ion implantation can be performed on the Si substrate 2 which gets exposed in the opening region 28 is formed.

Figure 4:
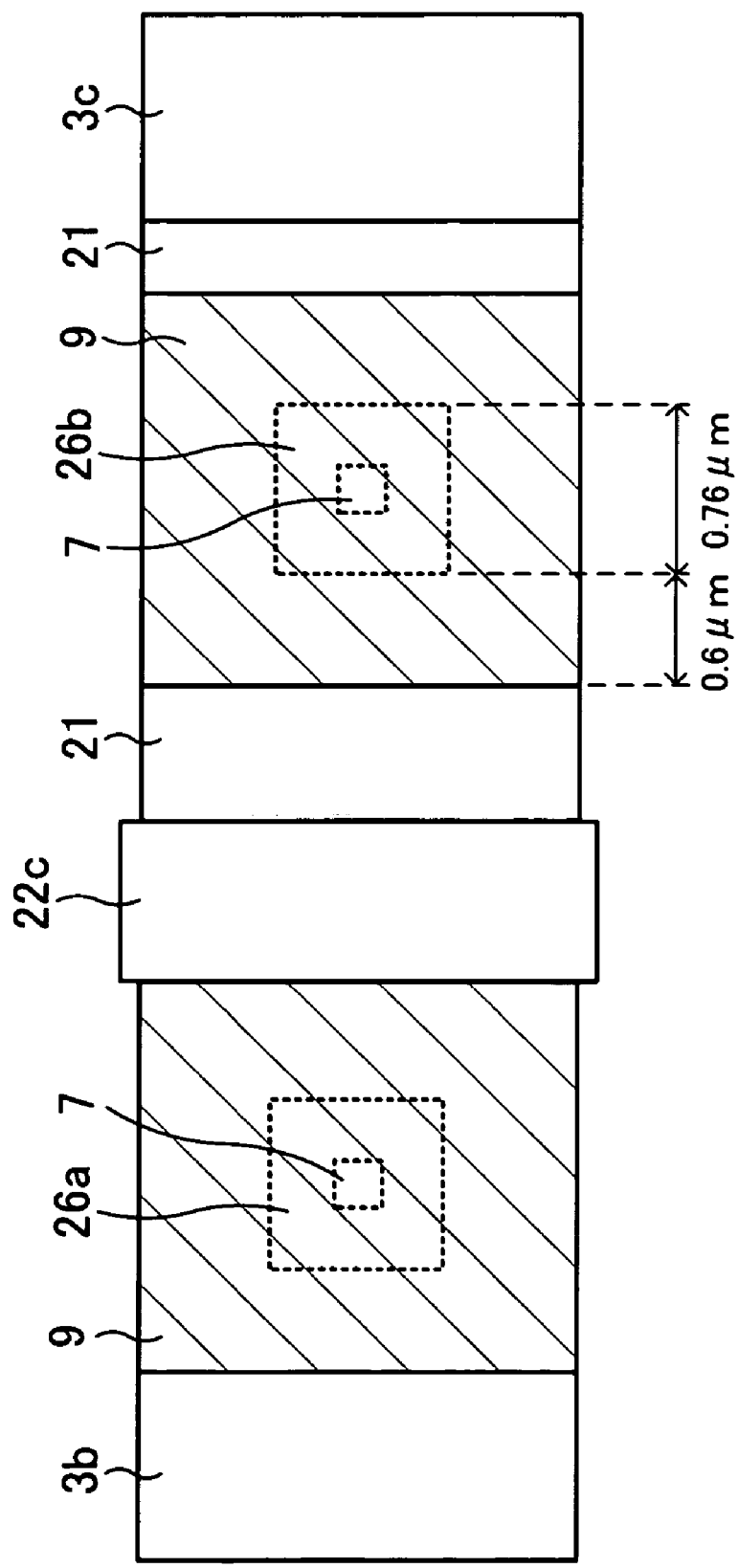
FIG. 4 is a schematic plan view showing an important part of an example of positions where a resist film is formed.
Figure 5:
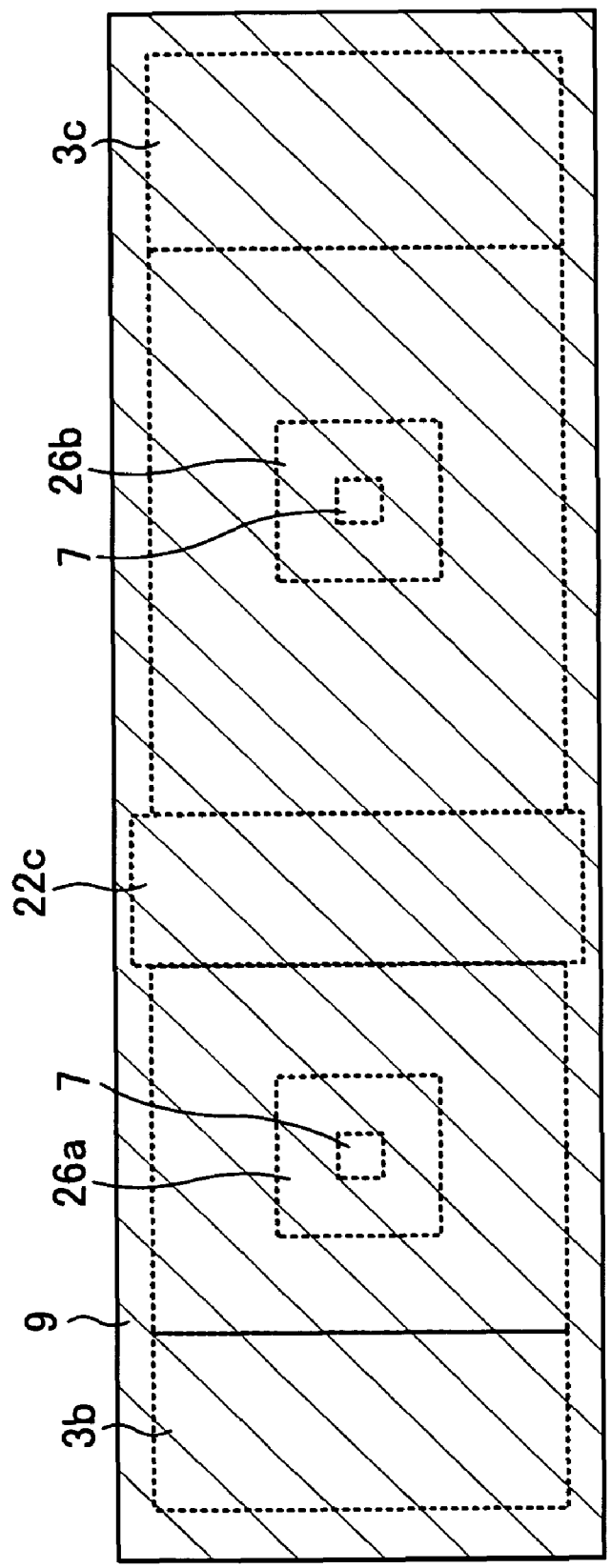
FIG. 5 is a schematic plan view showing an important part of an example of a conventional position where a resist film is formed.

FIG. 4 is a schematic plan view showing an important part of an example of positions where the resist film is formed. FIG. 5 is a schematic plan view showing an important part of an example of a conventional position where a resist film is formed. For convenience's sake, components in FIG. 4 or 5 that are the same as or correspond to those shown in FIG. 1, 2, or 3 are marked with the same symbols. In FIGS. 4 and 5, not only positions where the resist film 9 is formed but also positions where the silicide layers 26a and 26b and the plugs 7 are formed are shown. The sidewall insulating film 27 is not shown.

As shown in FIG. 4, if alignment accuracy, positional deviation accuracy, and the like at pattern formation time is taken into consideration, the size of the resist film 9 formed on the region where the high-breakdown-voltage transistor 20 is to be formed should be about 0.6 μm larger than that of the opening region 28 to be formed. That is to say, the distance between edges of the silicide layer 26b and the resist film 9 should be about 0.6 μm. If the opening region 28 is square and the length of one side is about 0.76 μm, then the resist film 9 formed on the drain region is square and the length of one side is about 1.96 μm. Therefore, the area of the resist film 9 formed on the drain region in the region where the high-breakdown-voltage transistor 20 is to be formed is about 3.84 $μm^2$ (=1.96×1.96).

With the high-breakdown-voltage transistor 20 to the drain region of which a high voltage is applied, usually the source region is made smaller than the drain region with electrical resistance between a source and a drain taken into consideration. Therefore, if the area of the source region is made approximately equal to that of the drain region, the total area of the resist film 9 is maximized and is about 3.84 $μm^2$×2 (see FIG. 4).

Traditionally, on the other hand, the entire surface of a region where a high-breakdown-voltage transistor is to be formed has been covered with a resist film. In this case, usually a resist pattern is formed by using data for forming a well region in the region where a high-breakdown-voltage transistor is to be formed. Accordingly, as shown in FIG. 5, a large resist film 9 is formed so as to cover the entire surface of the element region. Even if the area of the resist film 9 formed in the way shown in FIG. 4 is maximized, the area of the resist film 9 formed in the conventional way can be reduced by about four fifths.

By performing etching with the resist film 9 formed in the above way as a mask, the sidewall insulating film 27 and the gate insulating film 11 are removed on the logic transistor 10 side and the Si substrate 2 (the low concentration source region 14a and the low concentration drain region 14b) gets exposed. The area of the resist film 9 is small, so the sidewall 13 having a proper shape is formed. On the high-breakdown-voltage transistor 20 side, on the other hand, the sidewall 23 is formed as a result of this etching. However, the gate insulating film 21 is thick, so the gate insulating film 21 remains on the Si substrate 2.

The resist film 9 is then removed. A resist pattern for forming the opening region through which ion implantation is performed for forming the high concentration source region 25a and the high concentration drain region 25b of the high-breakdown-voltage transistor 20 is formed and etching is performed. As a result, all or the major part of the surface of the Si substrate 2 between the sidewall 23 and the isolation region 3b gets exposed on the source region side of the high-breakdown-voltage transistor 20. On the drain region side of the high-breakdown-voltage transistor 20, the opening region 28 enclosed by the two-layer structure including the gate insulating film 21 and the sidewall insulating film 27 is formed and the surface of the Si substrate 2 gets exposed only in the opening region 28. In this state, ion implantation and the formation of silicide are performed. By doing so, the semiconductor device 1 having the structure shown in FIGS. 1 and 2 can be fabricated.

As stated above, by making the area of the resist film 9 formed on the high-breakdown-voltage transistor 20 side at the time of forming the sidewall 13 of the logic transistor 10 as small as possible, the sidewall 13 having a proper shape can be formed. This prevents a deterioration in the characteristics, such as a drop in current, of the logic transistor 10. With a logic transistor not having a lightly doped grain (LDD) structure, a change in the shape of a sidewall, that is to say, a wide sidewall causes a significant drop in current. Accordingly, the above method is very effective especially for fabricating such a logic transistor.

The opening region 28 enclosed by the two-layer structure including the gate insulating film 21 and the sidewall insulating film 27 is formed on the drain region of the high-breakdown-voltage transistor 20. After the opening region 28 is formed, ion implantation is performed to form the high concentration drain region 25b in the Si substrate 2 which is exposed in the opening region 28. That is to say, the high concentration drain region 25b can be formed in the low concentration drain region 24b on a self align basis with respect to the low concentration drain region 24b. The low concentration drain region 24b is formed so that its edges will be securely separate from the edges of the isolation region 3c and the gate electrode 22. In addition, the silicide layer 26b can also be formed on the high concentration drain region 25b formed in this way on a self align basis with respect to the low concentration drain region 24b. The silicide layer 26b is formed so that its edges will be securely separate from the edges of the isolation region 3c and the gate electrode 22. As a result, the breakdown voltage of the high-breakdown-voltage transistor 20 can be secured sufficiently. Moreover, by suppressing the deviation of a place where the high concentration drain region 25b is formed or variation in impurity concentration, variation or a drop in breakdown voltage can effectively be prevented.

In the above descriptions, the opening region 28 enclosed by the two-layer structure including the gate insulating film 21 and the sidewall insulating film 27 is formed only on the drain region of the high-breakdown-voltage transistor 20. However, the opening region 28 having the same structure may also be formed on the source region of the high-breakdown-voltage transistor 20. Usually a high voltage is not applied to the source region of the high-breakdown-voltage transistor 20, so it is not necessary that the structure of the opening region 28 formed on the source region should be the same as that of the opening region 28 formed on the drain region. If the source and drain of the high-breakdown-voltage transistor 20 must be used as a drain and a source respectively, then the structure of a source region should be symmetrical to that of the above drain region.

A method for fabricating a semiconductor device having the above structure will now be described in detail by taking a concrete example. A method for fabricating a semiconductor device in which an n-channel logic transistor, a p-channel logic transistor, an n-channel high-breakdown-voltage transistor, and a p-channel high-breakdown-voltage transistor are formed on one Si substrate will be described in order with reference to FIGS. 6 through 31.

Figure 6:
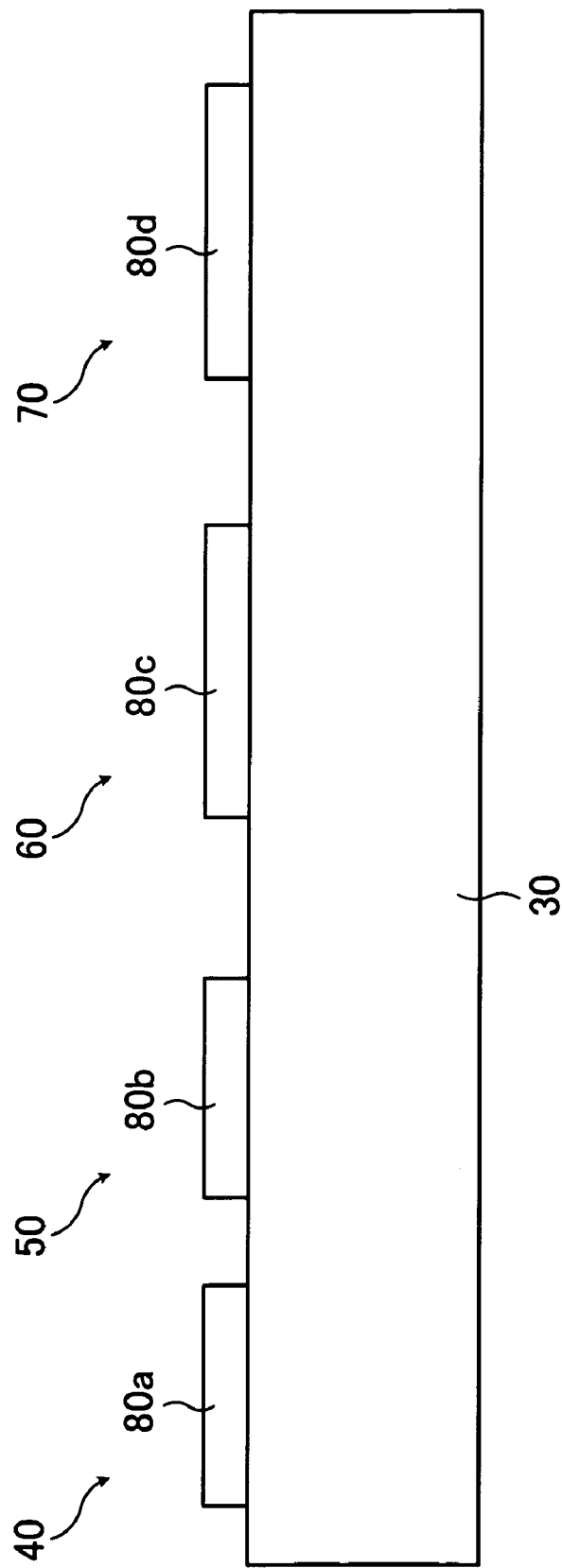
FIG. 6 is a schematic sectional view showing an important part of an isolation region pattern formation process.

FIG. 6 is a schematic sectional view showing an important part of an isolation region pattern formation process.

First, masks 80a, 80b, 80c, and 80d are formed on a region (n-channel logic transistor section) 40 in an Si substrate 30 where an n-channel logic transistor is to be formed, a region (p-channel logic transistor section) 50 in the Si substrate 30 where a p-channel logic transistor is to be formed, a region (n-channel high-breakdown-voltage transistor section) 60 in the Si substrate 30 where an n-channel high-breakdown-voltage transistor is to be formed, and a region (p-channel high-breakdown-voltage transistor section) 70 in the Si substrate 30 where a p-channel high-breakdown-voltage transistor is to be formed, respectively.

The masks 80a, 80b, 80c, and 80d can be formed by using, for example, an SiN film. In this case, an $SiO_2$ film with a thickness of about 3 nm is formed first on the entire surface of the Si substrate 30 by initial oxidation. An SiN film with a thickness of about 115 nm is then formed on the $SiO_2$ film by, for example, the CVD method. Patterning is performed by photolithography and the SiN film over regions where isolation regions are to be formed is removed by etching. As a result, the masks 80a, 80b, 80c, and 80d shown in FIG. 6 are formed.

Figure 7:
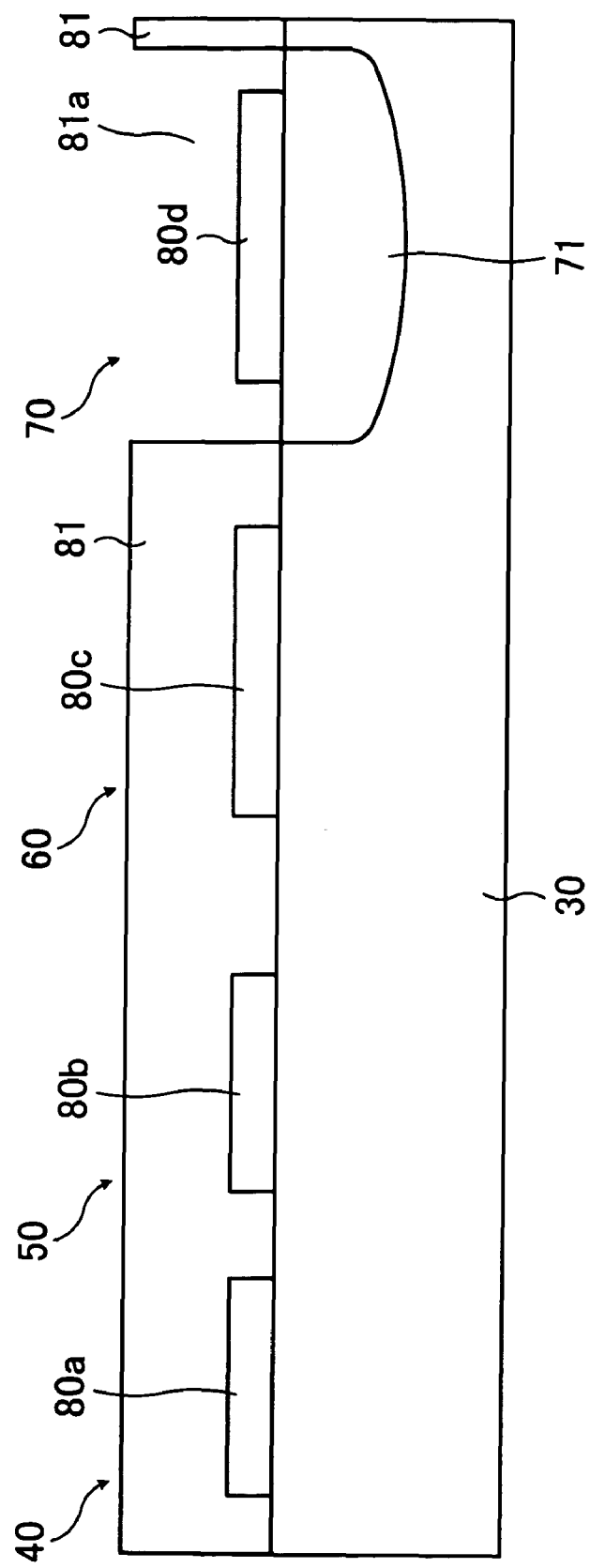
FIG. 7 is a schematic sectional view showing an important part of a process for forming a well region in a p-channel high-breakdown-voltage transistor section.

FIG. 7 is a schematic sectional view showing an important part of a process for forming a well region in the p-channel high-breakdown-voltage transistor section.

After the masks 80a, 80b, 80c, and 80d are formed, a resist film 81 is formed on an entire surface. An opening portion 81a is formed on the p-channel high-breakdown-voltage transistor section 70 by the photolithography. An n-type well region 71 is formed in the Si substrate 30 by implanting n-type impurity ions. For example, to form the n-type well region 71, phosphorus (P) is used as n-type impurities and ion implantation is performed first under the condition that acceleration voltage and a dosage level should be about 1.7 MeV and $3.0\times10^{12}$ $cm^{-2}$ respectively. Ion implantation is then performed under the condition that acceleration voltage and a dosage level should be about 180 MeV and $1.0\times10^{12}$ $cm^{-2}$ respectively. After that, the resist film 81 is removed.

Figure 8:
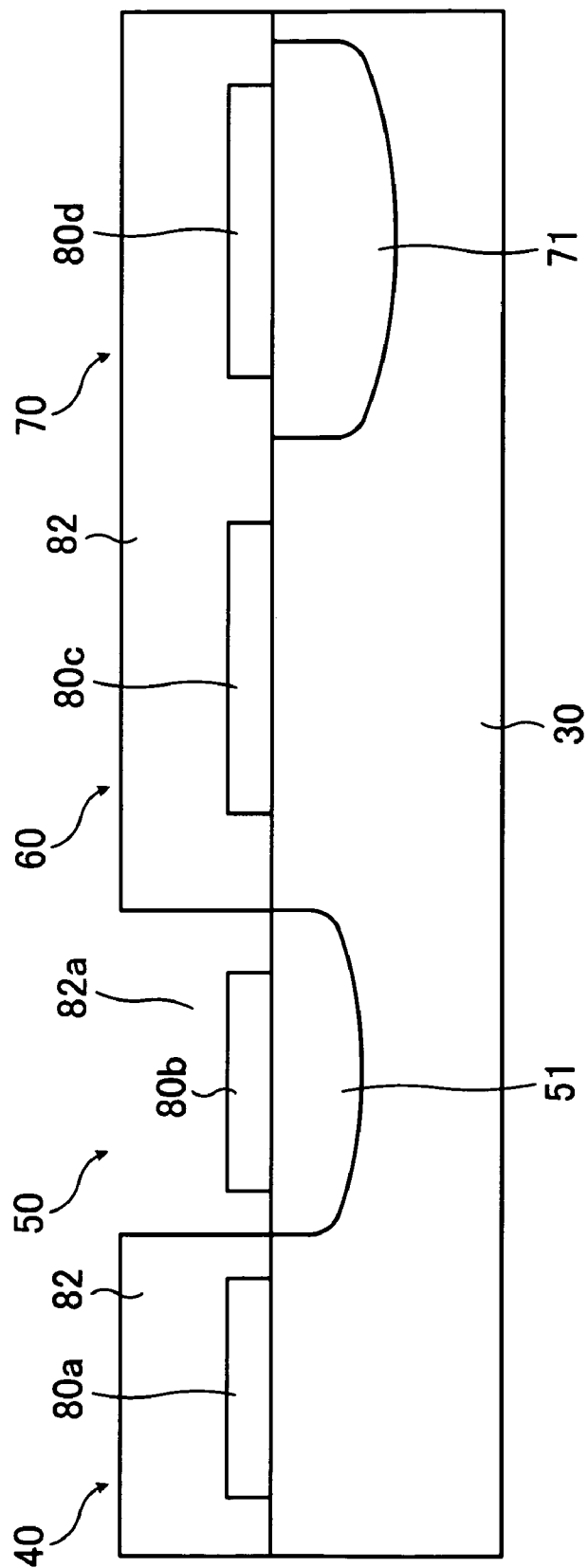
FIG. 8 is a schematic sectional view showing an important part of a process for forming a well region in a p-channel logic transistor section.

FIG. 8 is a schematic sectional view showing an important part of a process for forming a well region in the p-channel logic transistor section.

To form an n-type well 51 in the p-channel logic transistor section 50, a resist film 82 is formed first on an entire surface. An opening portion 82a is then formed on the p-channel logic transistor section 50 by the photolithography. For example, by using phosphorus (P) as n-type impurities, ion implantation is performed under the condition that acceleration voltage and a dosage level should be about 180 MeV and $1.44\times10^{13}$ $cm^{-2}$ respectively. After that, the resist film 82 is removed.

Figure 9:
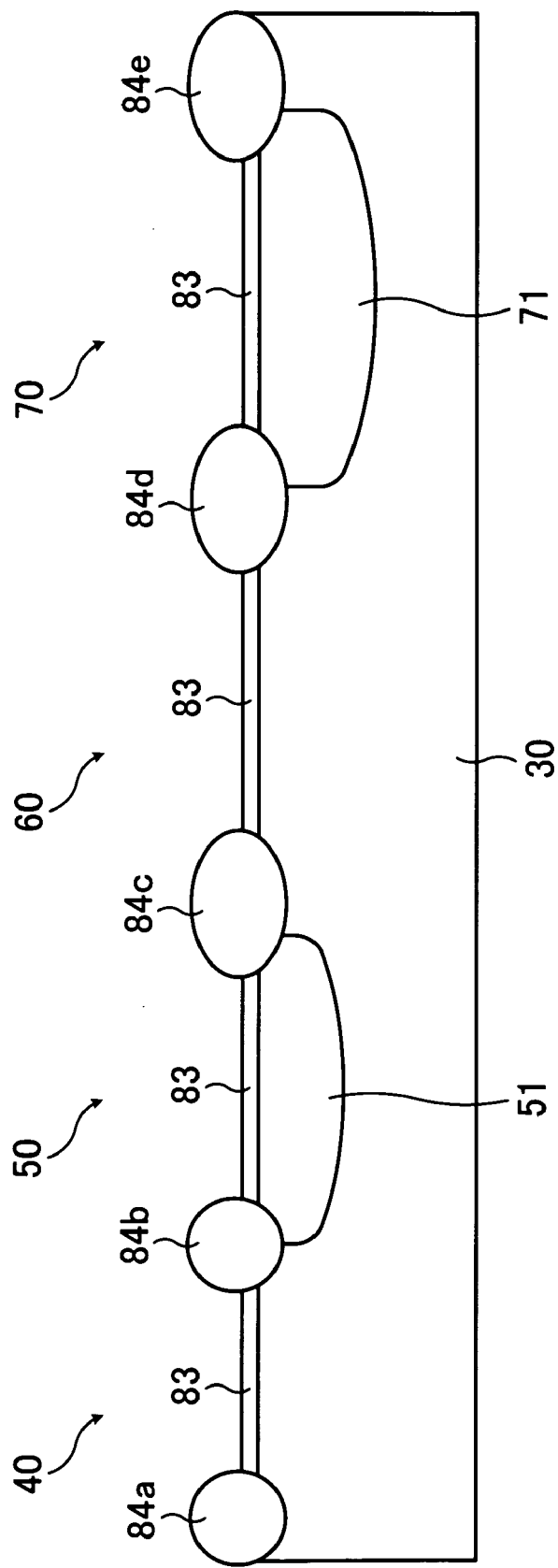
FIG. 9 is a schematic sectional view showing an important part of an isolation region formation process.

FIG. 9 is a schematic sectional view showing an important part of an isolation region formation process.

After the resist film 82 is removed, an $SiO_2$ film 83 with a thickness of about 35 nm is formed on the Si substrate 30 by performing oxidation in an oxidative atmosphere including a small amount of hydrogen chloride (HCl) at a temperature of about 1,000° C. and heat treatment is then performed in an atmosphere of an inert gas at a temperature of about 1,150° C. for 60 minutes. After the heat treatment is performed, oxidation is performed in an oxidative atmosphere at a temperature of about 900° C. to form a field oxide film with a thickness of about 350 nm. As a result, isolation regions 84a, 84b, 84c, 84d, and 84e are formed. After that, the masks 80a, 80b, 80c, and 80d made of an SiN film are removed.

Figure 10:
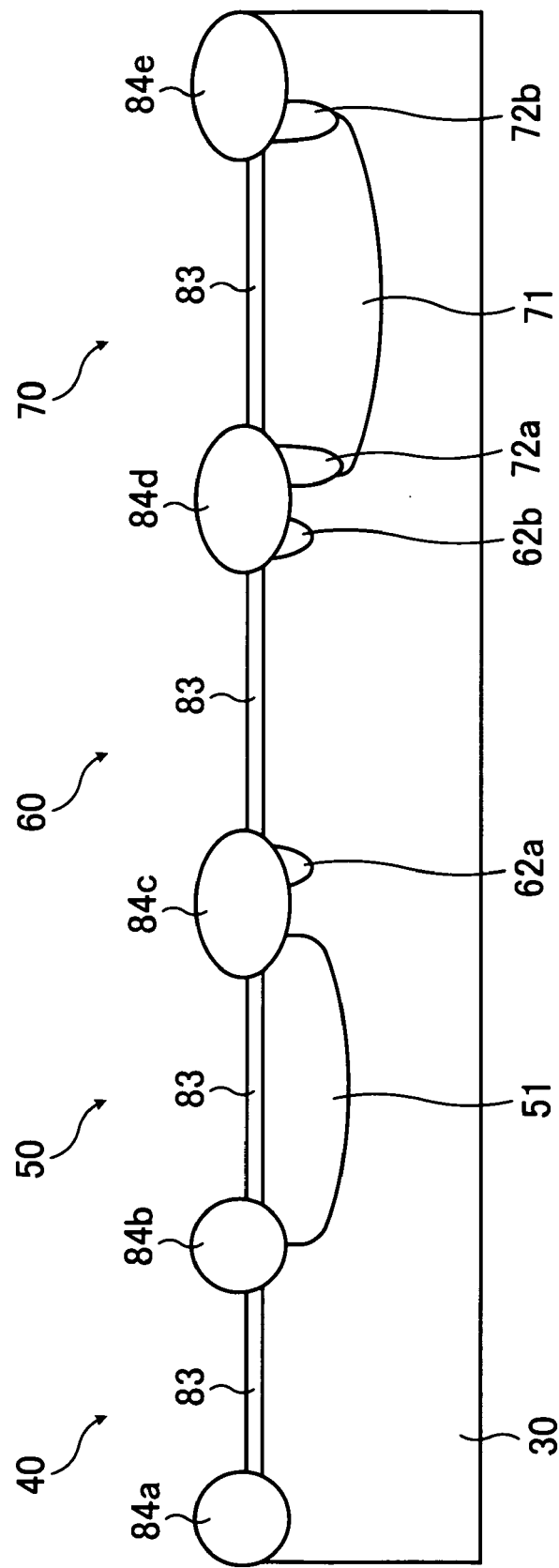
FIG. 10 is a schematic sectional view showing an important part of a process for forming channel stop regions in high-breakdown-voltage transistor sections.

FIG. 10 is a schematic sectional view showing an important part of a process for forming channel stop regions in the high-breakdown-voltage transistor sections.

After the masks 80a, 80b, 80c, and 80d are removed, a sacrificial oxide film with a thickness of about 20 nm is formed by performing oxidation in an oxidative atmosphere including HCl. Opening portions for forming channel stop regions in the n-channel high-breakdown-voltage transistor section 60 are formed by the photolithography. p-type impurity ions are then implanted to form channel stop regions 62a and 62b. For example, to form the channel stop regions 62a and 62b, boron (B) is used as p-type impurities and ion implantation is performed under the condition that acceleration voltage and a dosage level should be about 140 KeV and $1.3\times10^{14}$ $cm^{-2}$ respectively.

Channel stop regions 72a and 72b are formed in the p-channel high-breakdown-voltage transistor section 70 in the same way. That is to say, opening portions are formed in predetermined regions by the photolithography. For example, by using phosphorus (P) as n-type impurity ions, ion implantation is performed under the condition that acceleration voltage and a dosage level should be about 350 KeV and $1.8 \times 10^{13}$ cm$^{-2}$ respectively.

Figure 11:
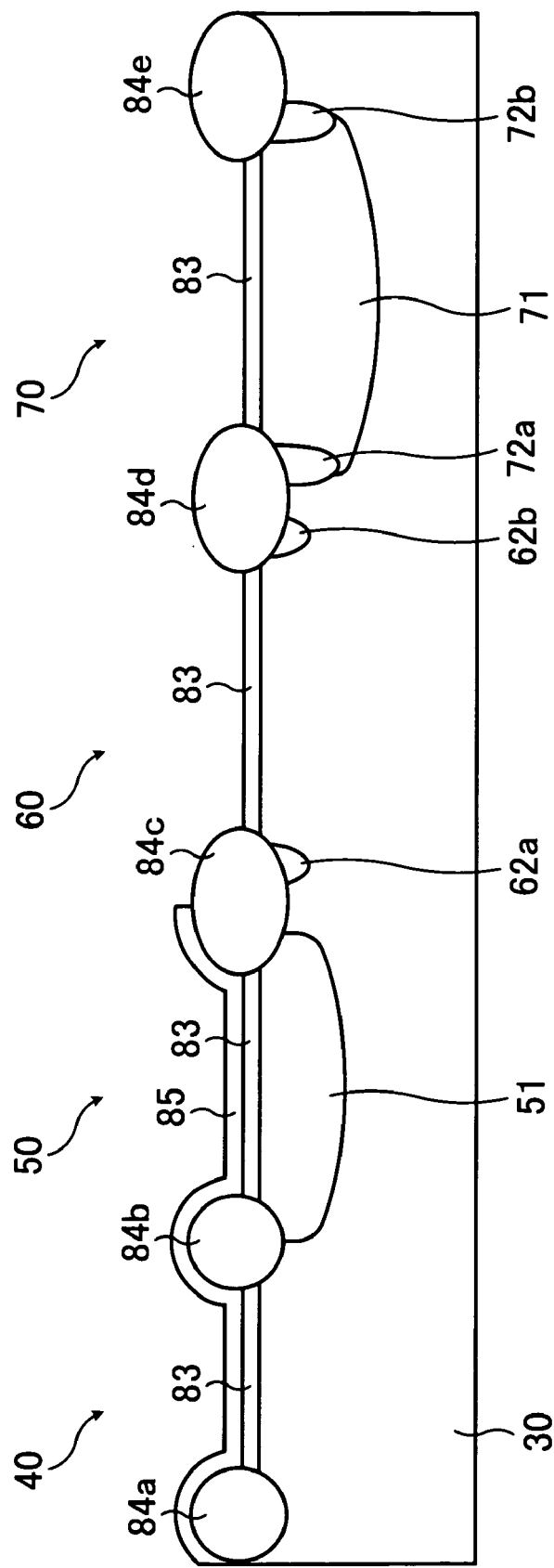
FIG. 11 is a schematic sectional view showing an important part of a selective mask formation process.

FIG. 11 is a schematic sectional view showing an important part of a selective mask formation process.

After the channel stop regions 62a, 62b, 72a, and 72b are formed, an SiN film with a thickness of about 35 nm is formed first on an entire surface by, for example, the CVD method. After a resist film on the entire surface of the n-channel high-breakdown-voltage transistor section 60 and the p-channel high-breakdown-voltage transistor section 70 is removed by the photolithography, the SiN film on the entire surface of the n-channel high-breakdown-voltage transistor section 60 and the p-channel high-breakdown-voltage transistor section 70 is removed by etching. As a result, a mask (selective mask) 85 made of the SiN film is formed only on the n-channel logic transistor section 40 and the p-channel logic transistor section 50.

Figure 12:
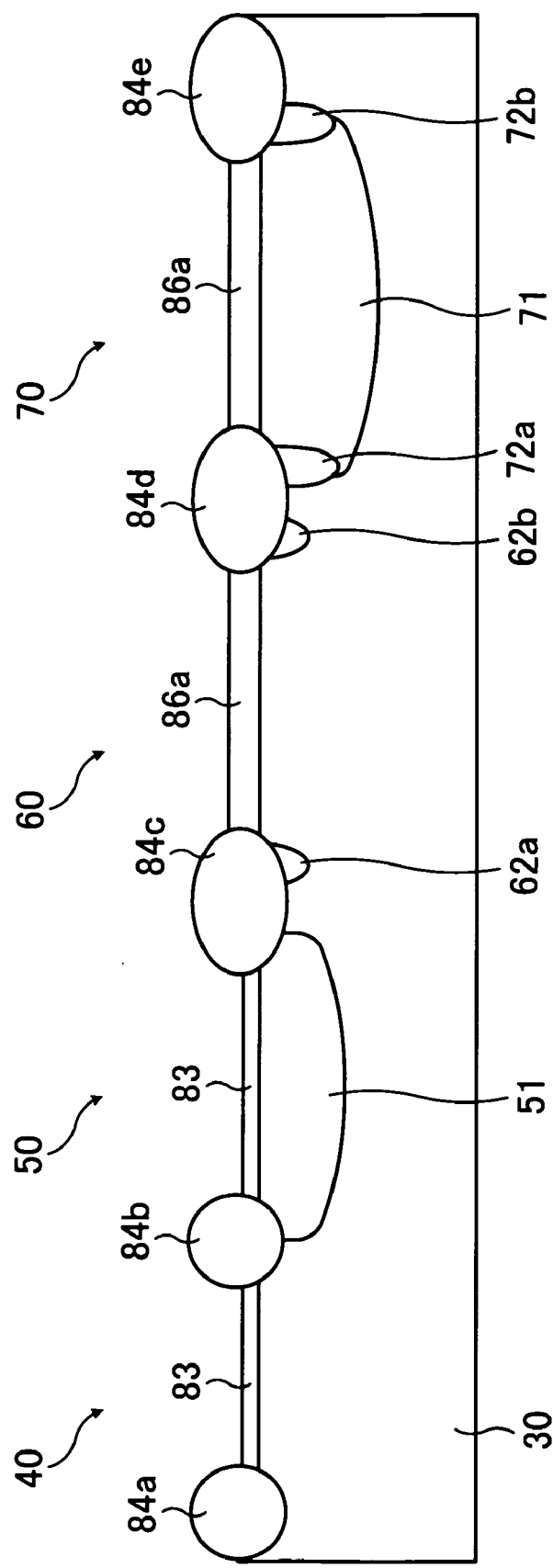
FIG. 12 is a schematic sectional view showing an important part of a process for forming a gate oxide film in the high-breakdown-voltage transistor sections.

FIG. 12 is a schematic sectional view showing an important part of a process for forming a gate oxide film in the high-breakdown-voltage transistor sections.

After the selective mask 85 is formed, oxidation is performed at a temperature of about 1,000° C. By doing so, a gate oxide film 86a including the SiO$_2$ film 83 previously formed is formed on the n-channel high-breakdown-voltage transistor section 60 and the p-channel high-breakdown-voltage transistor section 70 where the selective mask 85 is not formed. The total thickness of the gate oxide film 86a including the SiO$_2$ film 83 is about 120 nm. The thickness of the gate oxide film 86a is set according to breakdown voltage required of the n-channel high-breakdown-voltage transistor and the p-channel high-breakdown-voltage transistor. As stated above, the thickness of the gate oxide film 86a at this stage should be about 120 nm if power supply voltage is, for example, about 25 to 32 V. After the gate oxide film 86a is formed, the selective mask 85 is removed.

Figure 13:
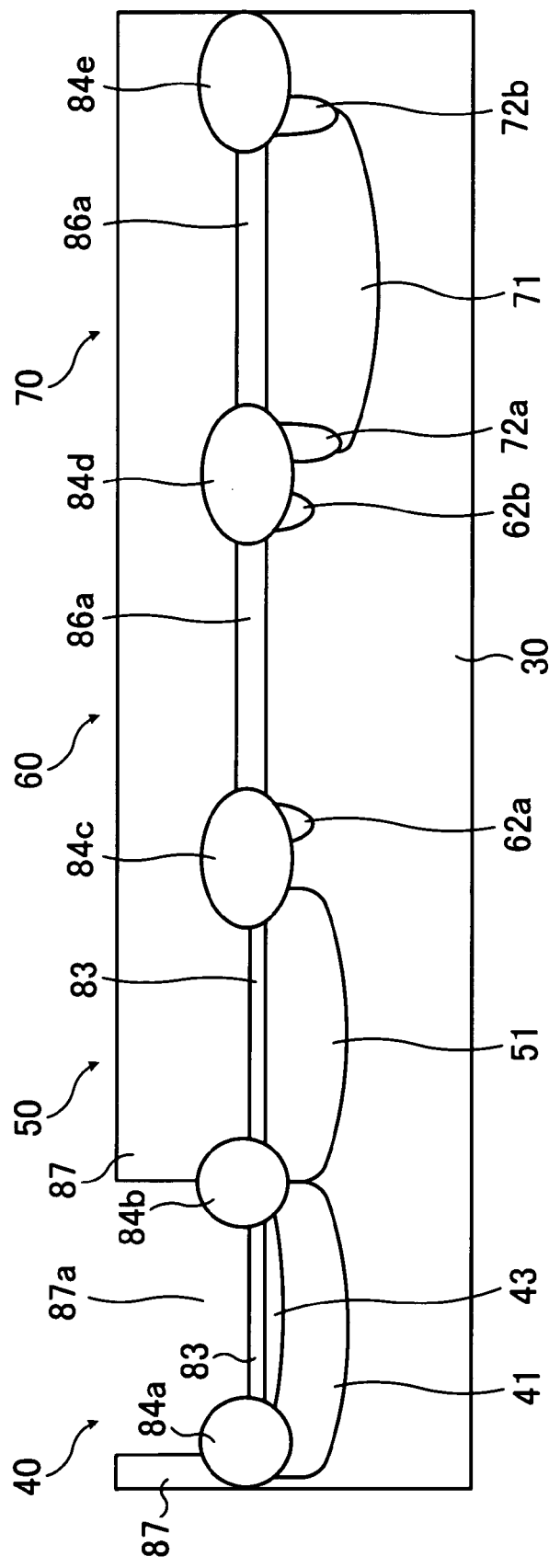
FIG. 13 is a schematic sectional view showing an important part of a process for forming a well region in an n-channel logic transistor section.

FIG. 13 is a schematic sectional view showing an important part of a process for forming a well region in the n-channel logic transistor section.

After the selective mask 85 is removed, a resist film 87 is formed first on an entire surface. An opening portion 87a is then formed on the n-channel logic transistor section 40 by the photolithography. To form a p-type well 41, boron (B) is used as p-type impurities and ion implantation is performed under the condition that acceleration voltage and a dosage level should be about 140 KeV and $8.0 \times 10^{12}$ cm$^{-2}$ respectively. After that, to form a channel doped region 43 for adjusting threshold voltage, boron (B) is used and ion implantation is performed under the condition that acceleration voltage and a dosage level should be about 30 KeV and $2.5 \times 10^{12}$ cm$^{-2}$ respectively. The resist film 87 is then removed.

Figure 14:
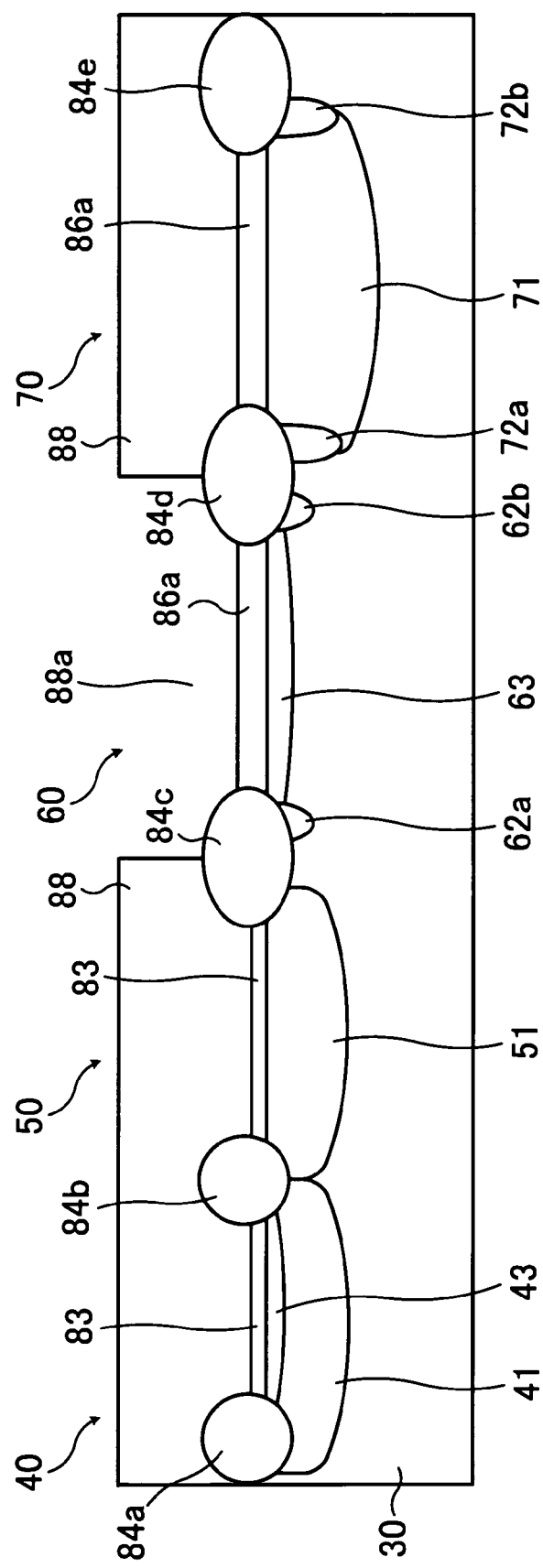
FIG. 14 is a schematic sectional view showing an important part of a process for forming a channel doped region in an n-channel high-breakdown-voltage transistor section.

FIG. 14 is a schematic sectional view showing an important part of a process for forming a channel doped region in the n-channel high-breakdown-voltage transistor section.

A resist film 88 is then formed again on an entire surface. An opening portion 88a is formed on the n-channel high-breakdown-voltage transistor section 60 by the photolithography. To form a channel doped region 63 for adjusting threshold voltage in the n-channel high-breakdown-voltage transistor section 60, boron (B) is used and ion implantation is performed under the condition that acceleration voltage and a dosage level should be about 55 KeV and $4.0 \times 10^{11}$ cm$^{-2}$ respectively. The resist film 88 is then removed.

Figure 15:
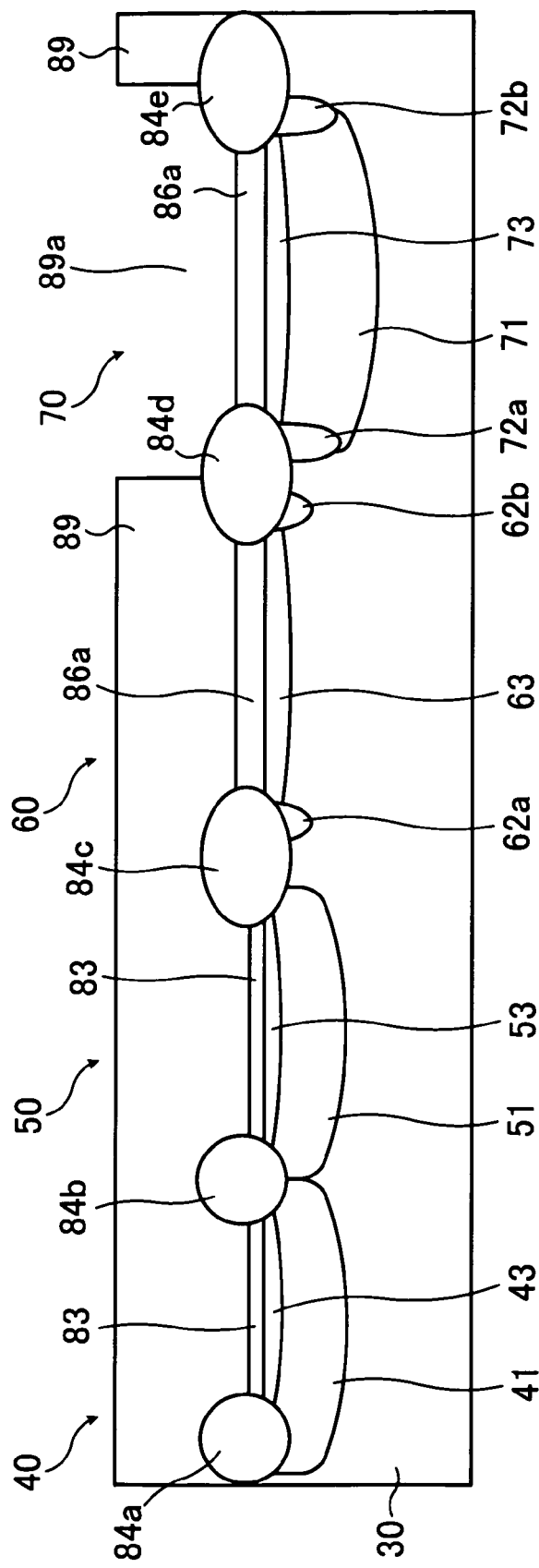
FIG. 15 is a schematic sectional view showing an important part of a process for forming a channel doped region in the p-channel high-breakdown-voltage transistor section.

FIG. 15 is a schematic sectional view showing an important part of a process for forming a channel doped region in the p-channel high-breakdown-voltage transistor section.

A channel doped region 53 is formed first in the p-channel logic transistor section 50 in the same way. A resist film 89 is then formed on an entire surface. An opening portion 89a is formed on the p-channel high-breakdown-voltage transistor section 70 by the photolithography. By using boron (B), ion implantation is performed under the condition that acceleration voltage and a dosage level should be about 55 KeV and $7.0 \times 10^{11}$ cm$^{-2}$ respectively. By doing so, a channel doped region 73 for adjusting threshold voltage is also formed in the p-channel high-breakdown-voltage transistor section 70. The resist film 89 is then removed.

Figure 16:
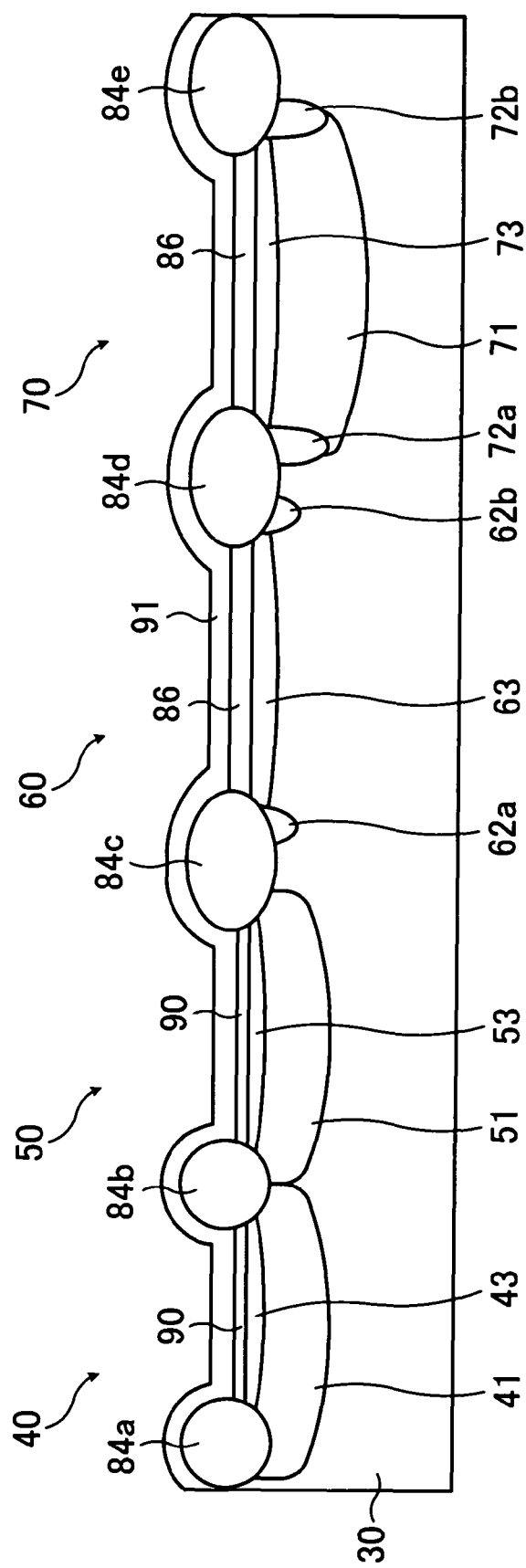
FIG. 16 is a schematic sectional view showing an important part of a process for forming a gate oxide film in the logic transistor sections.

FIG. 16 is a schematic sectional view showing an important part of a process for forming a gate oxide film in the logic transistor sections.

After the channel doped regions 43, 53, 63, and 73 are formed, predetermined pretreatment is performed and oxidation is performed at a temperature of about 800° C. As a result, a gate oxide film 90 with a thickness of about 7 nm is formed on the n-channel logic transistor section 40 and the p-channel logic transistor section 50.

On the other hand, a gate oxide film 86 including the gate oxide film 86a previously formed and the gate oxide film 90 formed at this stage is formed on the n-channel high-breakdown-voltage transistor section 60 and the p-channel high-breakdown-voltage transistor section 70. The thickness of the gate oxide film 86a on the n-channel high-breakdown-voltage transistor section 60 and the p-channel high-breakdown-voltage transistor section 70 has become about 90 nm before the formation of the gate oxide film 90 on the n-channel logic transistor section 40 and the p-channel logic transistor section 50 as a result of the pretreatment performed before the formation of the gate oxide film 90.

The CVD method, for example, is then used for forming a doped polycrystalline silicon film 91 the thickness of which is about 90 nm and the entire surface of which is doped with impurities for a gate electrode.

Figure 17:
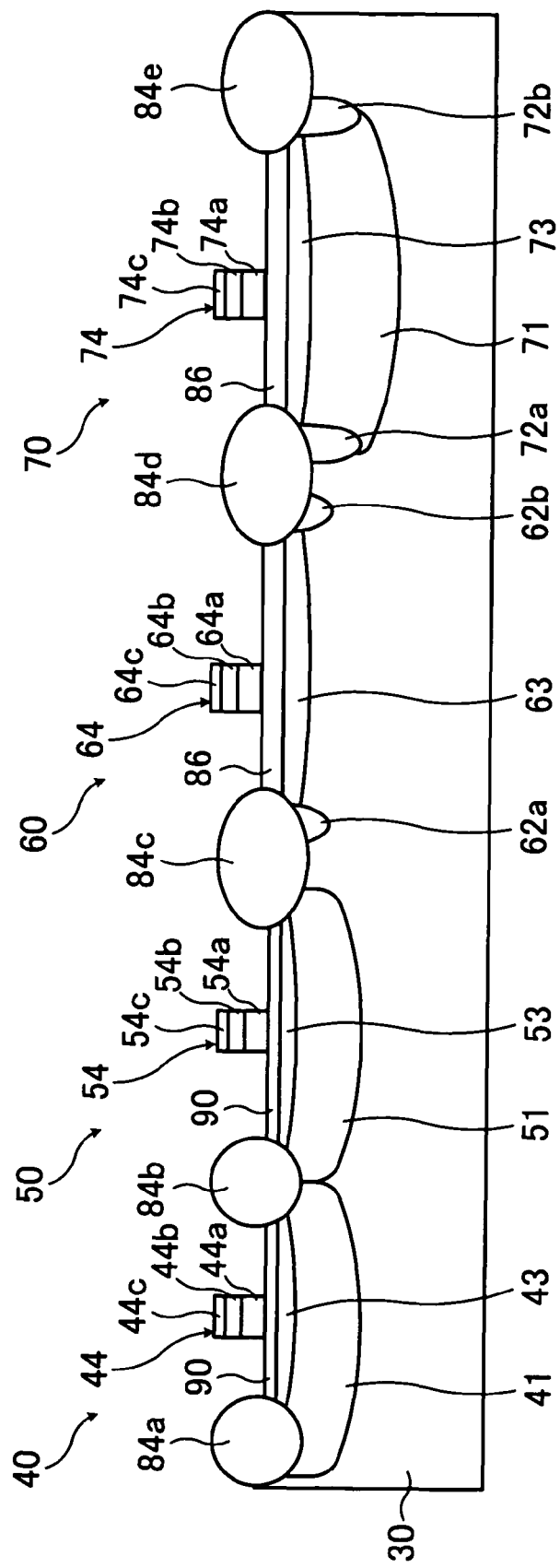
FIG. 17 is a schematic sectional view showing an important part of a gate electrode formation process.

FIG. 17 is a schematic sectional view showing an important part of a gate electrode formation process.

After the doped polycrystalline silicon film 91 is formed, an ordinary method is followed to, for example, form a tungsten film and perform heat treatment. By doing so, a tungsten silicide film with a thickness of about 140 nm is formed on the doped polycrystalline silicon film 91. The CVD method, for example, is then used for forming an SiO$_2$ film with a thickness of about 45 nm on the tungsten silicide film. Finally, predetermined patterning is performed and etching is performed. As a result, gate electrodes 44, 54, 64, and 74 are formed on the n-channel logic transistor section 40, the p-channel logic transistor section 50, the n-channel high-breakdown-voltage transistor section 60, and the p-channel high-breakdown-voltage transistor section 70 respectively. Each of the gate electrodes 44, 54, 64, and 74 is made up of three layers. That is to say, the gate electrodes 44, 54, 64, and 74 include polycrystalline silicon layers 44a, 54a, 64a, and 74a, being the doped polycrystalline silicon film 91, silicide layers 44b, 54b, 64b, and 74b, being the tungsten silicide film, and cap films 44c, 54c, 64c, and 74c, being the SiO$_2$ film, respectively.

Figure 18:
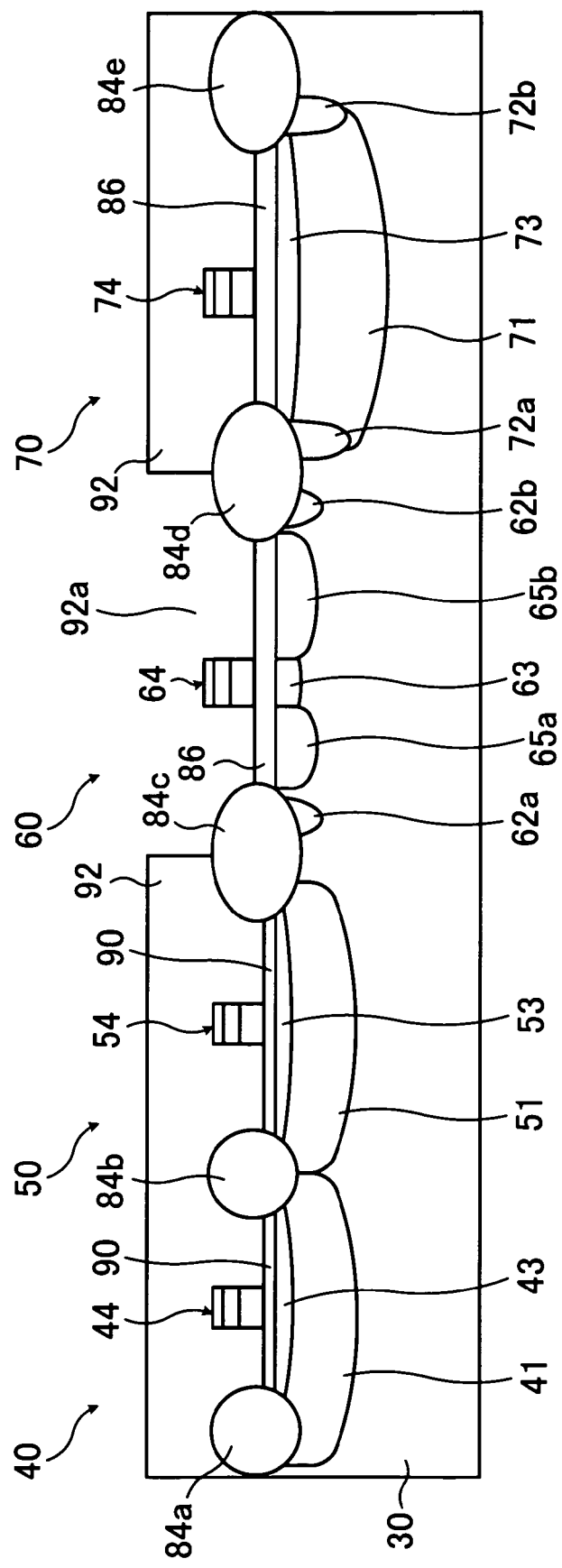
FIG. 18 is a schematic sectional view showing an important part of a process for forming low concentration source and drain regions in the n-channel high-breakdown-voltage transistor section.

FIG. 18 is a schematic sectional view showing an important part of a process for forming low concentration source and drain regions in the n-channel high-breakdown-voltage transistor section.

After the gate electrodes 44, 54, 64, and 74 are formed, a resist film 92 is formed first on an entire surface. An opening portion 92a is formed on the n-channel high-breakdown-voltage transistor section 60 by the photolithography. To form a low concentration source region 65a and a low concentration drain region 65b, phosphorus (P) is used as n-type impurities and ion implantation is performed with the gate electrode 64 as a mask under the condition that acceleration voltage and a dosage level should be about 100 to 120 KeV and $2.0\times10^{12}$ to $3.0\times10^{12}$ cm$^{-2}$, respectively. The resist film 92 is then removed.

Figure 19:
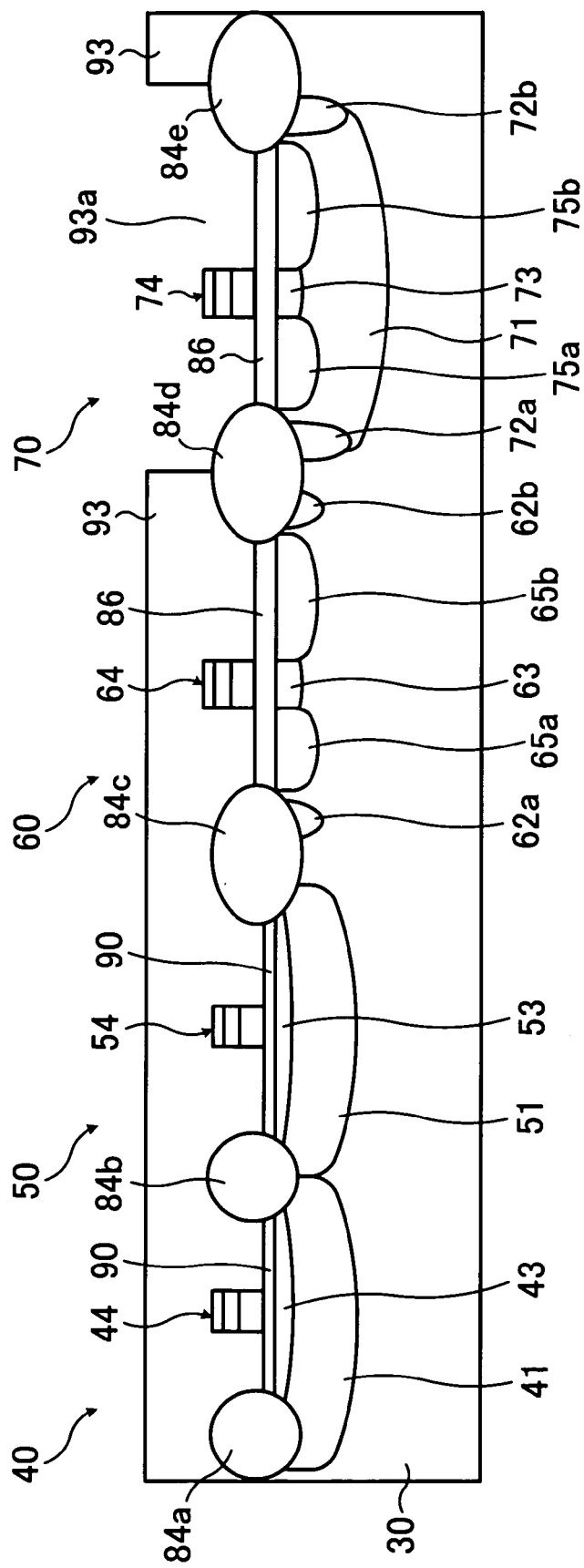
FIG. 19 is a schematic sectional view showing an important part of a process for forming low concentration source and drain regions in the p-channel high-breakdown-voltage transistor section.

FIG. 19 is a schematic sectional view showing an important part of a process for forming low concentration source and drain regions in the p-channel high-breakdown-voltage transistor section.

A low concentration source region 75a and a low concentration drain region 75b are formed in the p-channel high-breakdown-voltage transistor section 70 in the same way. A resist film 93 is formed first on an entire surface. An opening portion 93a is then formed on the p-channel high-breakdown-voltage transistor section 70 by the photolithography. By using boron (B) as p-type impurities, ion implantation is performed with the gate electrode 74 as a mask under the condition that acceleration voltage and a dosage level should be about 30 to 35 KeV and $2.0\times10^{12}$ to $3.0\times10^{12}$ cm$^{-2}$, respectively. The resist film 93 is then removed.

Figure 20:
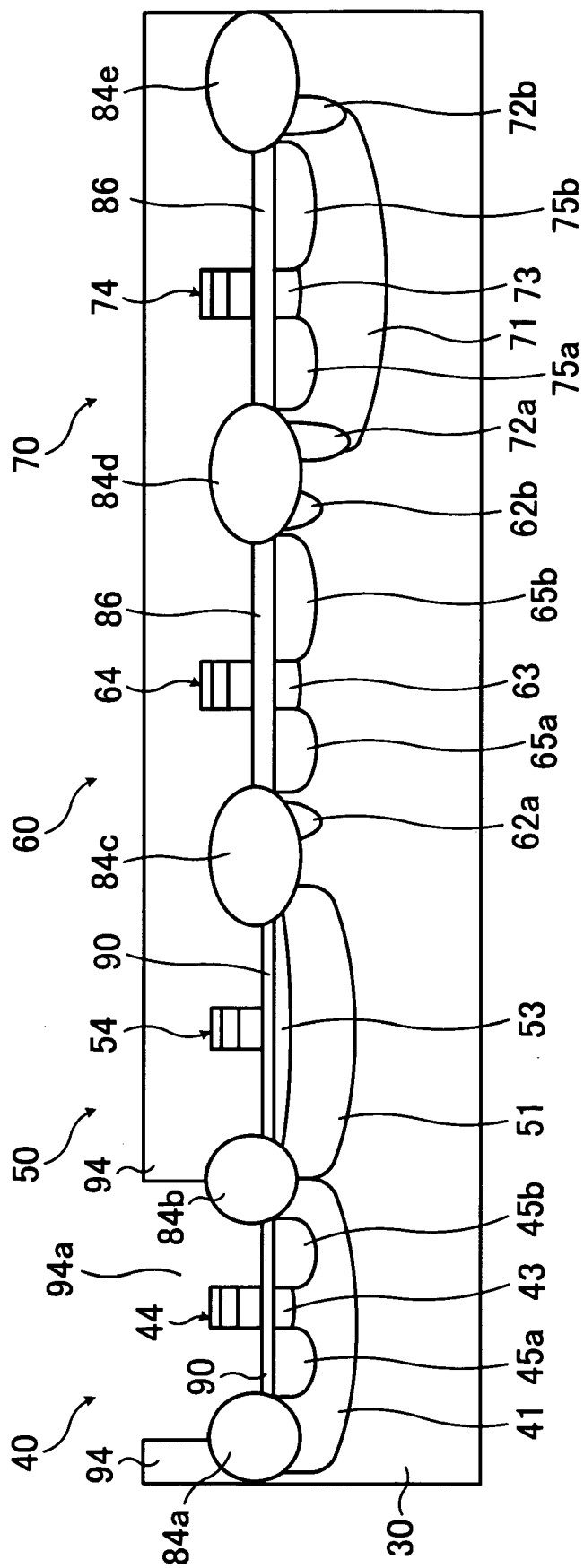
FIG. 20 is a schematic sectional view showing an important part of a process for forming low concentration source and drain regions in the n-channel logic transistor section.

FIG. 20 is a schematic sectional view showing an important part of a process for forming low concentration source and drain regions in the n-channel logic transistor section.

After that, a resist film 94 is formed first on an entire surface. An opening portion 94a is then formed on the n-channel logic transistor section 40 by the photolithography. To form a low concentration source region 45a and a low concentration drain region 45b, phosphorus (P) is used as n-type impurities and ion implantation is performed with the gate electrode 44 as a mask under the condition that acceleration voltage and a dosage level should be about 20 KeV and $4.0\times10^{13}$ cm$^{-2}$, respectively. The resist film 94 is then removed.

Figure 21:
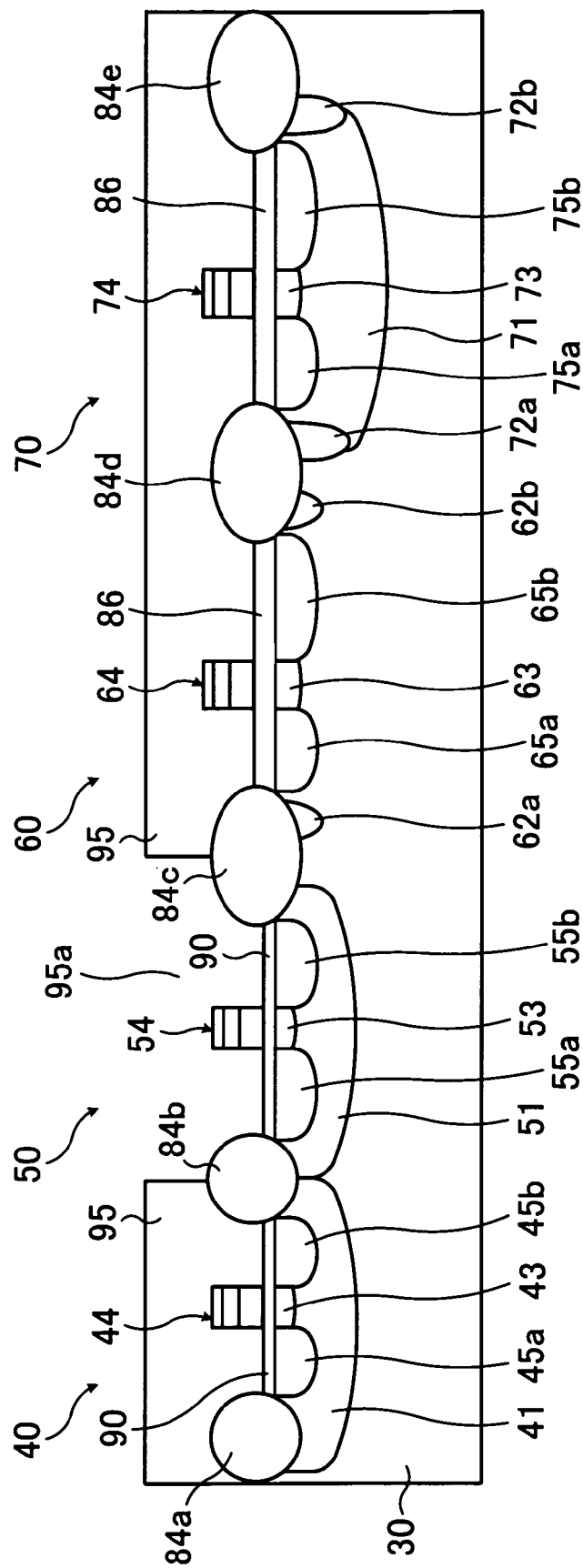
FIG. 21 is a schematic sectional view showing an important part of a process for forming low concentration source and drain regions in the p-channel logic transistor section.

FIG. 21 is a schematic sectional view showing an important part of a process for forming low concentration source and drain regions in the p-channel logic transistor section.

A low concentration source region 55a and a low concentration drain region 55b are formed in the p-channel logic transistor section 50 in the same way. A resist film 95 is formed first on an entire surface. An opening portion 95a is then formed on the p-channel logic transistor section 50 by the photolithography. By using boron difluoride (BF$_2^+$), ion implantation is performed with the gate electrode 54 as a mask under the condition that acceleration voltage and a dosage level should be about 20 KeV and $1.0\times10^{13}$ cm$^{-2}$, respectively. The resist film 95 is then removed.

Figure 22:
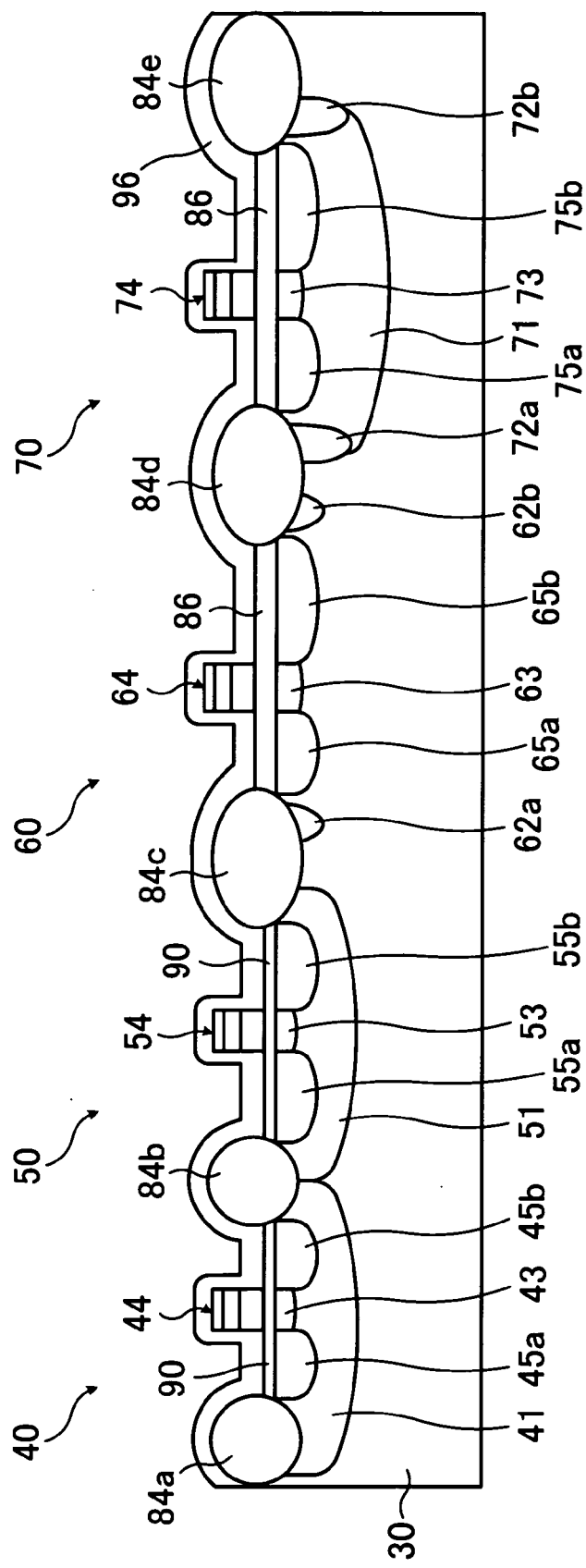
FIG. 22 is a schematic sectional view showing an important part of a sidewall oxide film formation process.

FIG. 22 is a schematic sectional view showing an important part of a sidewall oxide film formation process.

After the resist film 95 is removed, an SiO$_2$ film with a thickness of about 120 nm is formed on an entire surface by, for example, the CVD method. This SiO$_2$ film is a sidewall oxide film 96.

Figure 23:
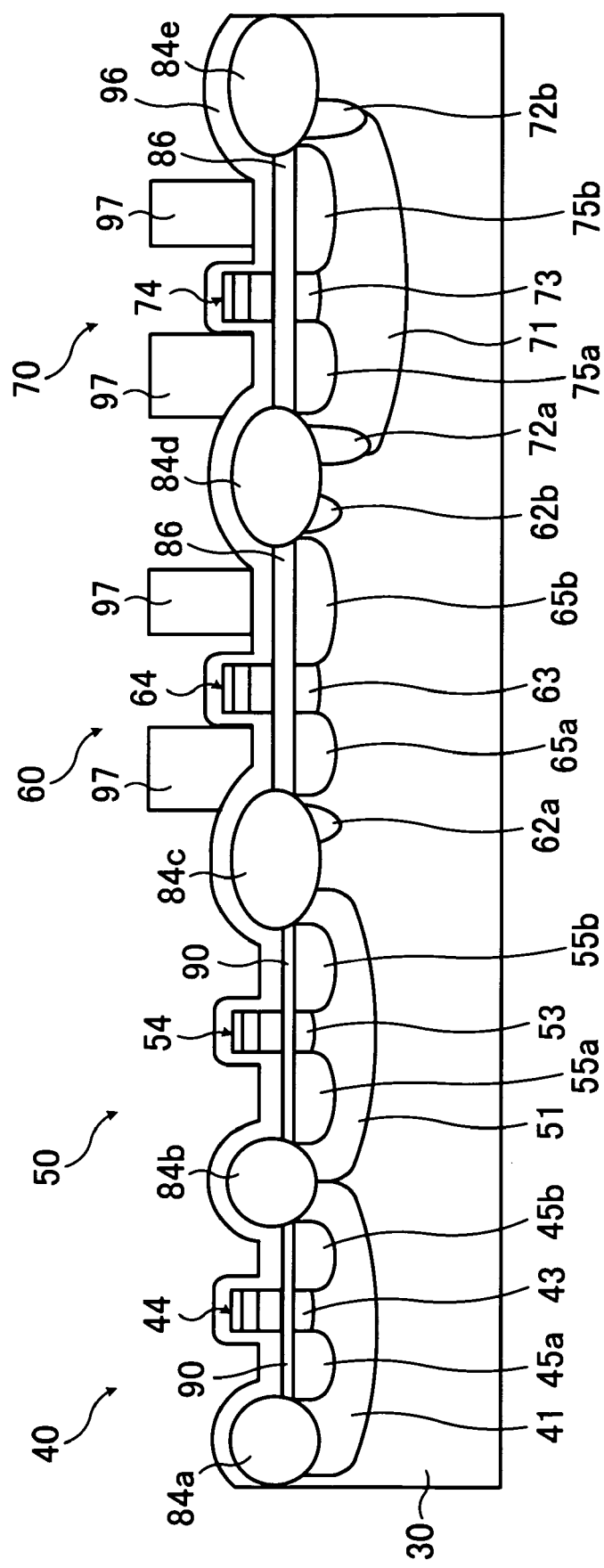
FIG. 23 is a schematic sectional view showing an important part of a first sidewall patterning process.

FIG. 23 is a schematic sectional view showing an important part of a first sidewall patterning process.

After that, patterning is performed by a resist film 97 to etch the sidewall oxide film 96 previously formed. In this case, the resist film 97 is formed first on an entire surface. All of the resist film 97 over the n-channel logic transistor section 40 and the p-channel logic transistor section 50 is removed and the resist film 97 is left over the low concentration source region 65a and the low concentration drain region 65b in the n-channel high-breakdown-voltage transistor section 60 and over the low concentration source region 75a and the low concentration drain region 75b in the p-channel high-breakdown-voltage transistor section 70. The smallest possible resist film 97 that enables the formation of opening portions in which the surface of the Si substrate 30 is exposed for forming high concentration drain regions in a later process and that enables the formation of a resist pattern for performing ion implantation on the Si substrate 30 through the opening portions should be left.

Figure 24:
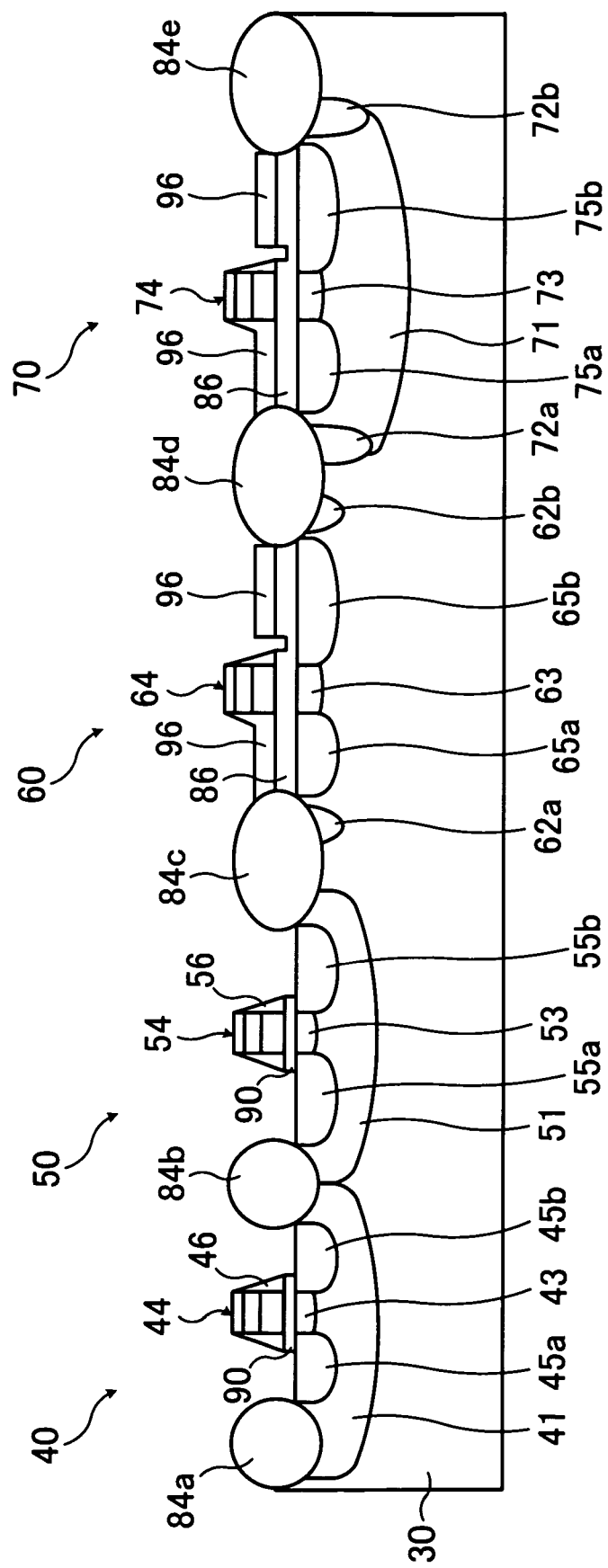
FIG. 24 is a schematic sectional view showing an important part of a first sidewall etching process.

FIG. 24 is a schematic sectional view showing an important part of a first sidewall etching process.

When etching is performed with the above resist film 97 as a mask, the sidewall oxide film 96 and major part of the gate oxide film 90 on the n-channel logic transistor section 40 and the p-channel logic transistor section 50 are removed. As a result, the low concentration source regions 45a and 55a and the low concentration drain regions 45b and 55b get exposed and sidewalls 46 and 56 are formed on the sides of the gate electrodes 44 and 54 respectively. In this case, the resist film 97 is formed so as to have the smallest possible area, so the sidewalls 46 and 56 each having a proper shape can be formed.

On the n-channel high-breakdown-voltage transistor section 60 and the p-channel high-breakdown-voltage transistor section 70, on the other hand, part of the sidewall oxide film 96 and part of the gate oxide film 86 are removed according to the shape of a pattern formed by the resist film 97. The resist film 97 is then removed.

Figure 25:
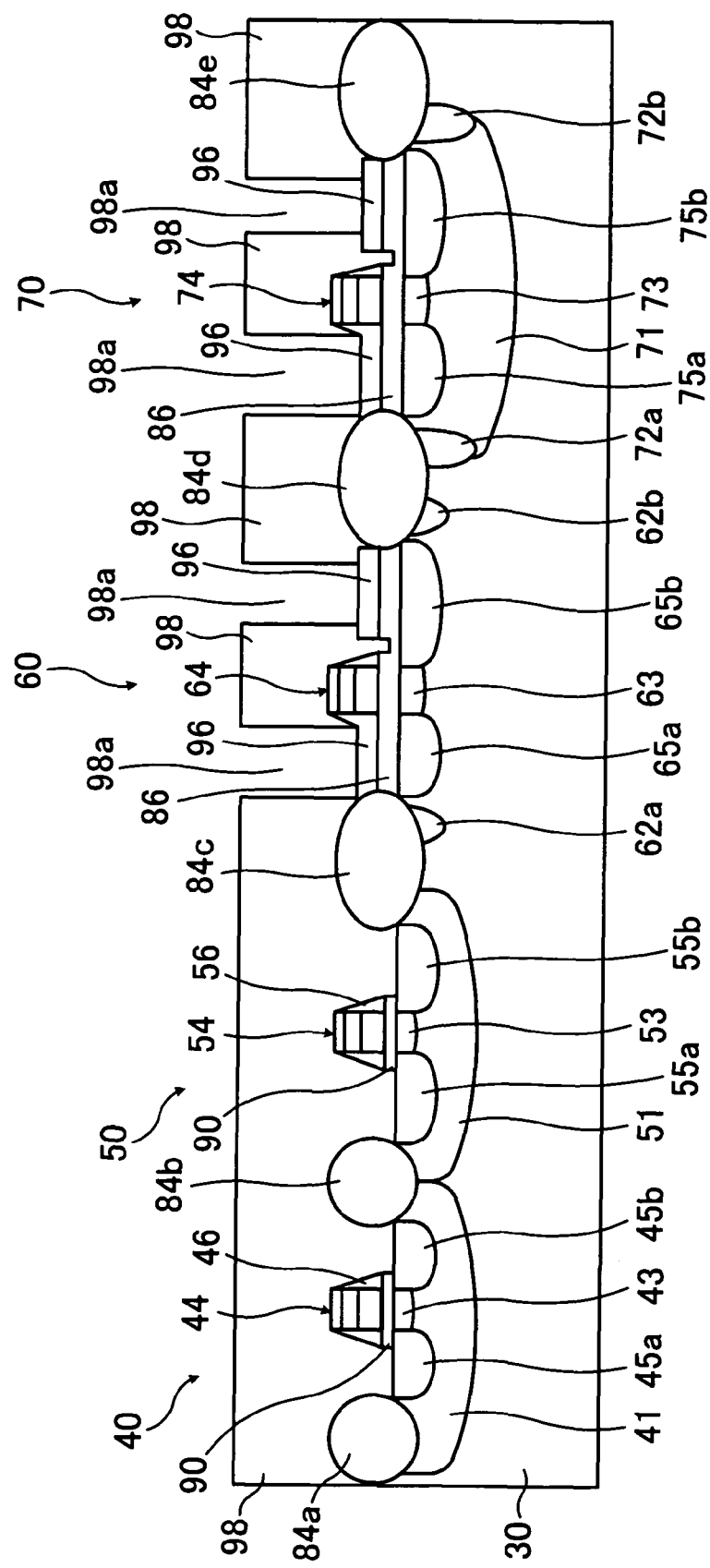
FIG. 25 is a schematic sectional view showing an important part of a second sidewall patterning process.

FIG. 25 is a schematic sectional view showing an important part of a second sidewall patterning process.

After that, a resist film 98 is formed again on an entire surface. Opening portions 98a for forming high concentration source and drain regions in the n-channel high-breakdown-voltage transistor section 60 and the p-channel high-breakdown-voltage transistor section 70 are formed.

A pattern by which each opening region formed when the sidewall oxide film 96 and the gate oxide film 86 are etched with the resist film 98 as a mask is enclosed by a two-layer structure including the sidewall oxide film 96 and the gate oxide film 86 should be used for forming the opening portions 98a in the resist film 98 especially on the drain regions. In this case, alignment accuracy, positional deviation accuracy, and the like at pattern formation time should be taken into consideration.

Figure 26:
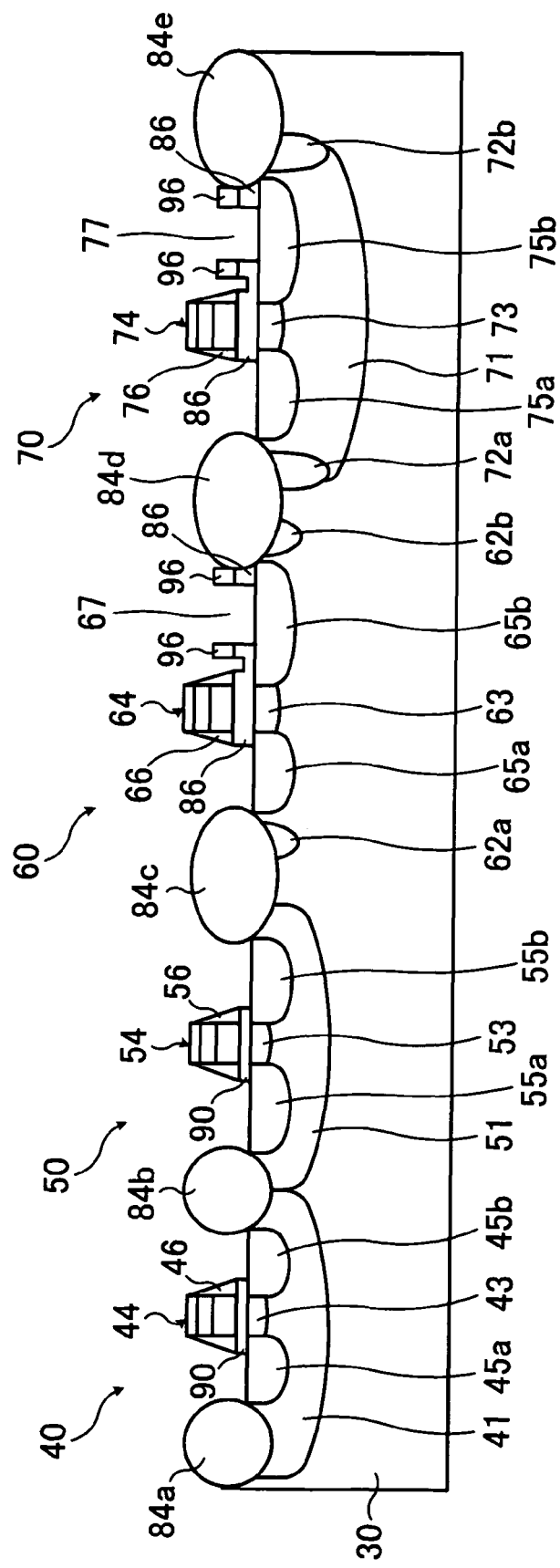
FIG. 26 is a schematic sectional view showing an important part of a second sidewall etching process.

FIG. 26 is a schematic sectional view showing an important part of a second sidewall etching process.

After the opening portions 98a are formed in the resist film 98, the sidewall oxide film 96 and the gate oxide film 86 on the n-channel high-breakdown-voltage transistor section 60 and the p-channel high-breakdown-voltage transistor section 70 are removed by performing etching with the resist film 98 as a mask. The resist film 98 is then removed.

As a result, in the n-channel high-breakdown-voltage transistor section 60 and the p-channel high-breakdown-voltage transistor section 70, the low concentration source regions 65a and 75a and the low concentration drain regions 65b and 75b get exposed and sidewalls 66 and 76 are formed on the sides of the gate electrodes 64 and 74 respectively. At this time, opening regions 67 and 77 each of which is enclosed by the two-layer structure including the sidewall oxide film 96 and the gate oxide film 86 are formed especially on the drain regions. The surface of the Si substrate 30 in the drain region in the n-channel high-breakdown-voltage transistor section 60 the distance from an edge of the gate electrode 64 or the isolation region 84d to which is smaller than or equal to a certain value and the surface of the Si substrate 30 in the drain region in the p-channel high-breakdown-voltage transistor section 70 the distance from an edge of the gate electrode 74 or the isolation region 84e to which is smaller than or equal to the certain value are covered with the sidewall oxide film 96 and the gate oxide film 86.

Figure 27:
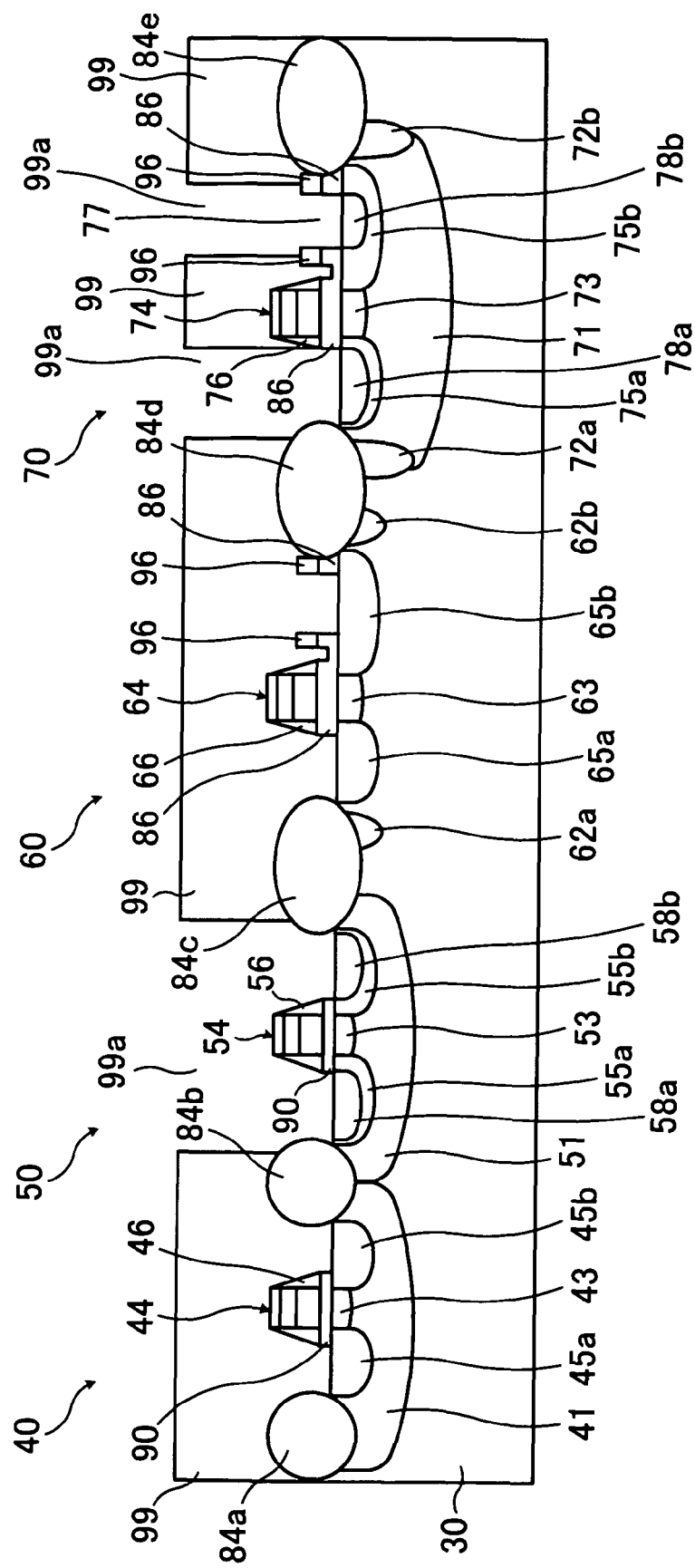
FIG. 27 is a schematic sectional view showing an important part of a process for forming high concentration source and drain regions in the p-channel regions.

FIG. 27 is a schematic sectional view showing an important part of a process for forming high concentration source and drain regions in the p-channel regions.

After that, a resist film 99 is formed on an entire surface. Opening portions 99a are formed on the low concentration source region 55a and the low concentration drain region 55b in the p-channel logic transistor section 50 and on the low concentration source region 75a and the low concentration drain region 75b in the p-channel high-breakdown-voltage transistor section 70. When the opening portions 99a are formed, a region except the opening region 77 of the drain region in the p-channel high-breakdown-voltage transistor section 70, particularly a region where only the gate oxide film 86 is formed should also be covered with the resist film 99.

By using $BF_2^+$, ion implantation is performed with the resist film 99 having the above pattern as a mask under the condition that acceleration voltage and a dosage level should be about 20 KeV and $3.0 \times 10^{15}$ cm$^{-2}$, respectively. By doing so, high concentration source regions 58a and 78a and high concentration drain regions 58b and 78b are formed in the low concentration source regions 55a and 75a and the low concentration drain regions 55b and 75b, respectively.

At this time, the opening region 77 on the drain region of the p-channel high-breakdown-voltage transistor section 70 is enclosed by a thick two-layer structure including the sidewall oxide film 96 and the gate oxide film 86. Therefore, even if the two-layer structure is not covered with the resist film 99, the two-layer structure can prevent $BF_2^+$ from being introduced into the Si substrate 30 (low concentration drain region 75b). As a result, the high concentration drain region 78b can be formed at a place which is securely separate from the gate electrode 74 and the isolation region 84e on a self align basis with respect to the low concentration drain region 75b.

The distance between the high concentration drain region 78b and the gate electrode 74 or between the high concentration drain region 78b and the isolation region 84e is set according to breakdown voltage required. A high voltage is not applied to the source region of the p-channel high-breakdown-voltage transistor section 70, so the source region need not have the same structure as the drain region.

After the high concentration source regions 58a and 78a and the high concentration drain regions 58b and 78b are formed in the p-channel logic transistor section 50 and the p-channel high-breakdown-voltage transistor section 70 in this way, the resist film 99 is removed.

Figure 28:
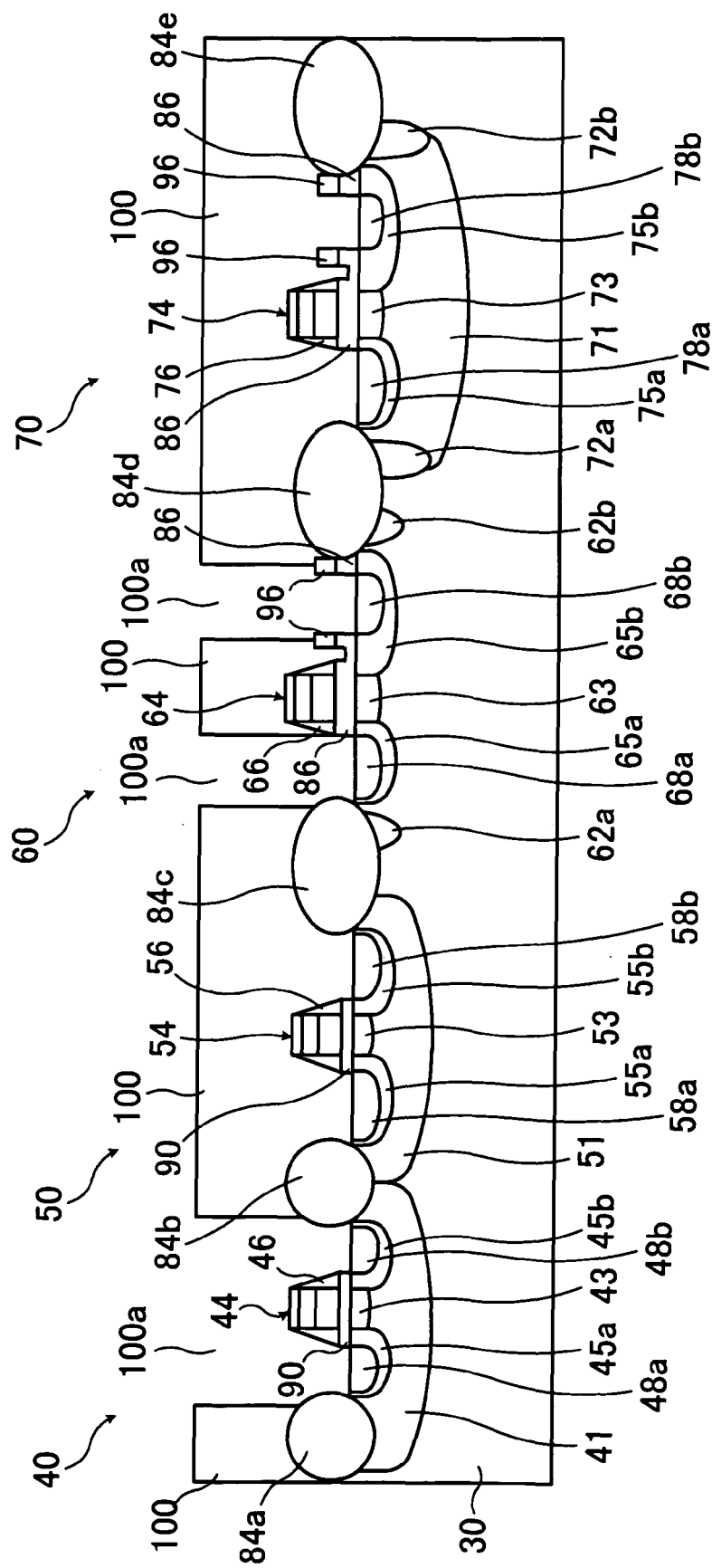
FIG. 28 is a schematic sectional view showing an important part of a process for forming high concentration source and drain regions in the n-channel regions.

FIG. 28 is a schematic sectional view showing an important part of a process for forming high concentration source and drain regions in the n-channel regions.

Similarly, after the resist film 99 is removed, a resist film 100 is formed first on an entire surface. Opening portions 100a are then formed on the low concentration source region 45a and the low concentration drain region 45b in the n-channel logic transistor section 40 and on the low concentration source region 65a and the low concentration drain region 65b in the n-channel high-breakdown-voltage transistor section 60. When the opening portions 100a are formed, a region except the opening region 67 of the drain region in the n-channel high-breakdown-voltage transistor section 60, particularly a region where only the gate oxide film 86 is formed should also be covered with the resist film 100. This is the same with FIG. 27.

By using arsenic (As), ion implantation is performed with the resist film 100 having the above pattern as a mask under the condition that acceleration voltage and a dosage level should be about 30 KeV and $1.0 \times 10^{15}$ cm$^{-2}$, respectively. By doing so, high concentration source regions 48a and 68a and high concentration drain regions 48b and 68b are formed in the low concentration source regions 45a and 65a and the low concentration drain regions 45b and 65b, respectively.

At this time, the opening region 67 on the drain region of the n-channel high-breakdown-voltage transistor section 60 is also enclosed by a thick two-layer structure including the sidewall oxide film 96 and the gate oxide film 86. This can prevent As from being introduced into the Si substrate 30 (low concentration drain region 65b) in the drain region except the opening region 67. This is the same with the p-channel high-breakdown-voltage transistor section 70. As a result, the high concentration drain region 68b can be formed at a place which is securely separate from the gate electrode 64 and the isolation region 84d on a self align basis with respect to the low concentration drain region 65b.

The distance between the high concentration drain region 68b and the gate electrode 64 or between the high concentration drain region 68b and the isolation region 84d is set according to breakdown voltage required. A high voltage is not applied to the source region of the n-channel high-breakdown-voltage transistor section 60, so the source region need not have the same structure as the drain region.

After the high concentration source regions 48a and 68a and the high concentration drain regions 48b and 68b are formed in the n-channel logic transistor section 40 and the n-channel high-breakdown-voltage transistor section 60 in this way, the resist film 100 is removed.

Figure 29:
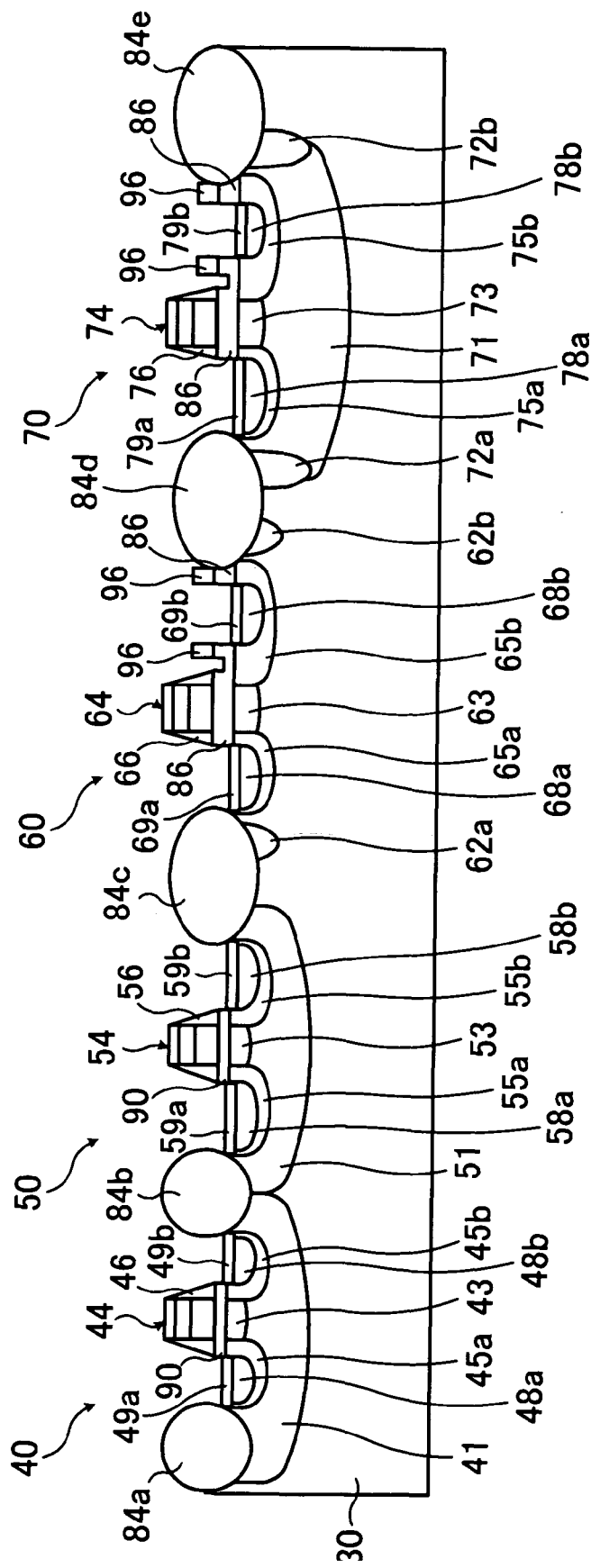
FIG. 29 is a schematic sectional view showing an important part of a silicide layer formation process.

FIG. 29 is a schematic sectional view showing an important part of a silicide layer formation process.

After the resist film 100 is removed, heat treatment is performed in an atmosphere of nitrogen ($N_2$) at a temperature of 1,000° C. for 10 seconds to activate introduced impurities. A titanium (Ti) film with a thickness of about 30 nm is then formed first on an entire surface by, for example, a sputtering method. Heat treatment is performed in an atmosphere of $N_2$ at a temperature of 705° C. for 90 seconds to form titanium silicide on exposed portions of the Si substrate 30. Ti which has not reacted yet is then removed by wet treatment. Finally, heat treatment is performed in an atmosphere of argon (Ar) at a temperature of 800° C. for 30 seconds.

As a result, silicide layers 49a, 59a, 69a, and 79a are formed on the high concentration source regions 48a, 58a, 68a, and 78a, respectively, and silicide layers 49b, 59b, 69b, and 79b are formed on the high concentration drain regions 48b, 58b, 68b, and 78b, respectively. The gate oxide film 86 and the sidewall oxide film 96 formed on regions except the opening regions 67 and 77 in the drain regions function as a silicide block, so the silicide layers 69b and 79b are formed at the same places where the high concentration drain regions 68b and 78b are formed on a self align basis with respect to the low concentration drain regions 65b and 75b respectively.

Figure 30:
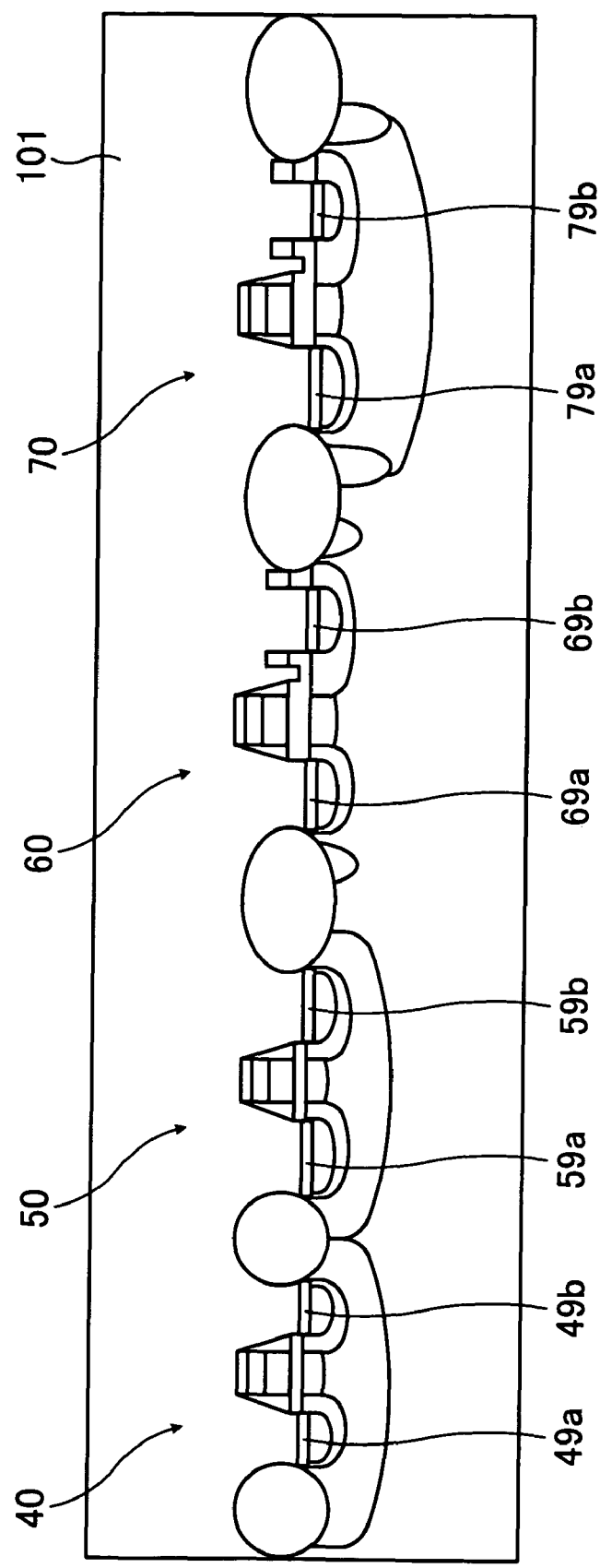
FIG. 30 is a schematic sectional view showing an important part of an interlayer dielectric film formation process.

FIG. 30 is a schematic sectional view showing an important part of an interlayer dielectric film formation process.

After the silicide layers are formed, a silicon oxide nitride (SiON) film with a thickness of about 200 nm is formed first on an entire surface by, for example, a plasma CVD method. An $SiO_2$ film with a thickness of about 300 nm is then formed by, for example, the plasma CVD method. Finally, spin on glass (SOG) with a thickness of about 200 nm is formed. By doing so, an interlayer dielectric film 101 with a total thickness of about 700 nm is formed.

Figure 31:
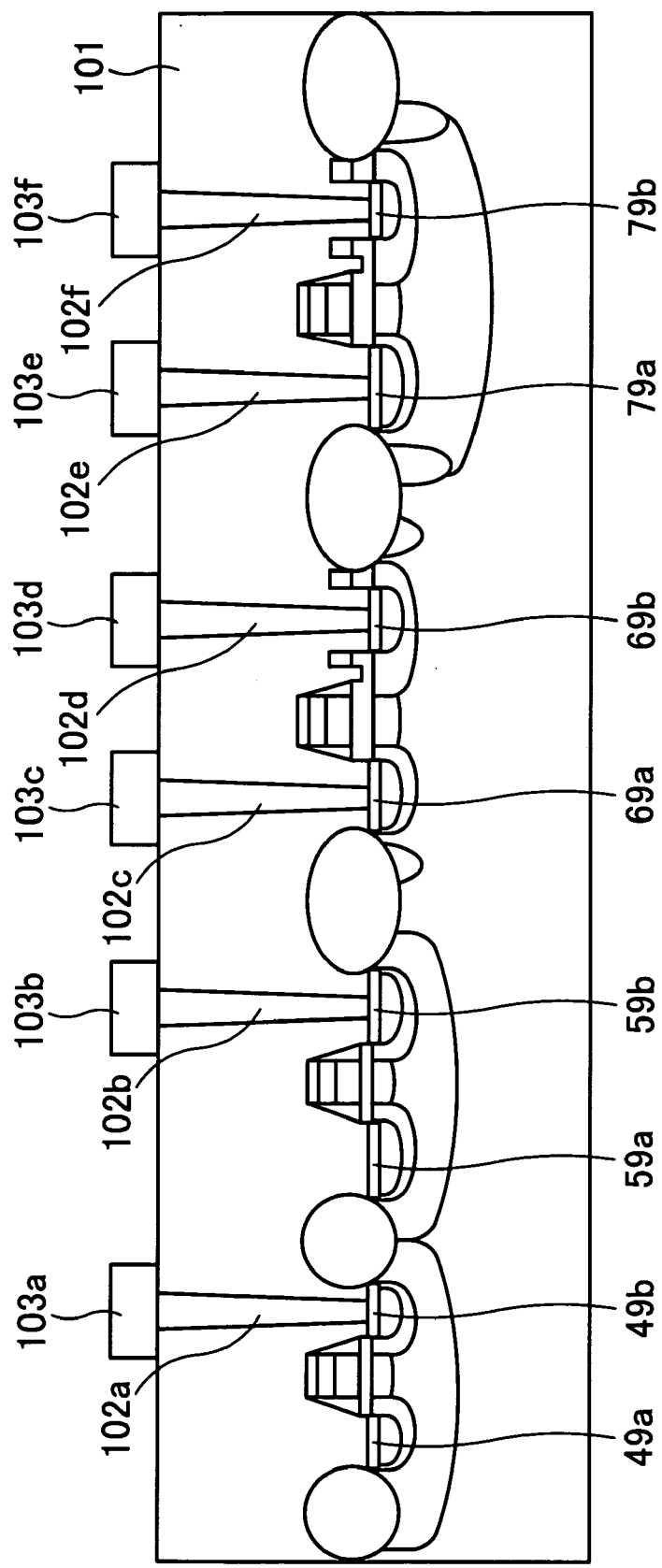
FIG. 31 is a schematic sectional view showing an important part of a contact and wiring formation process.
Figure 32:
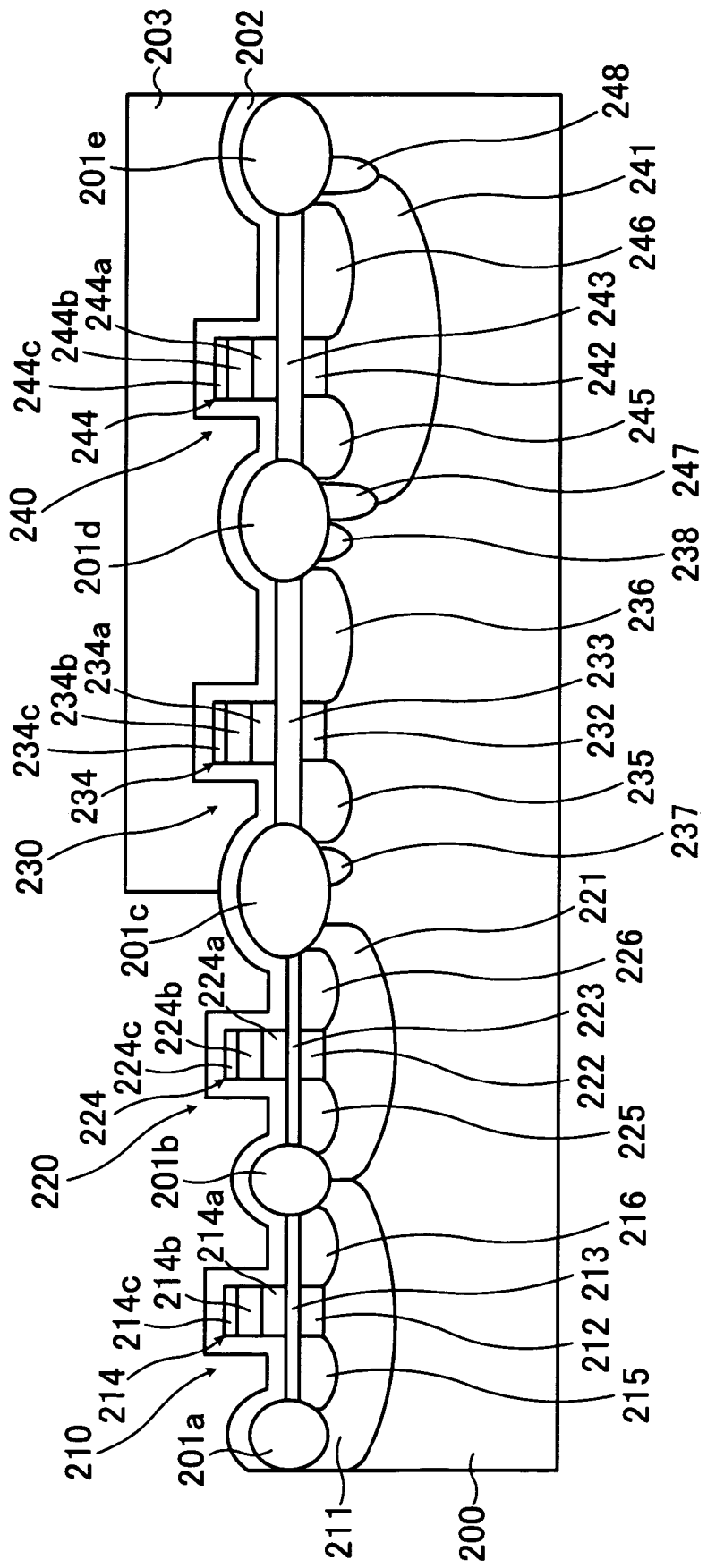
FIG. 32 is a schematic sectional view showing an important part of an example of a sidewall formation process.
Figure 33:
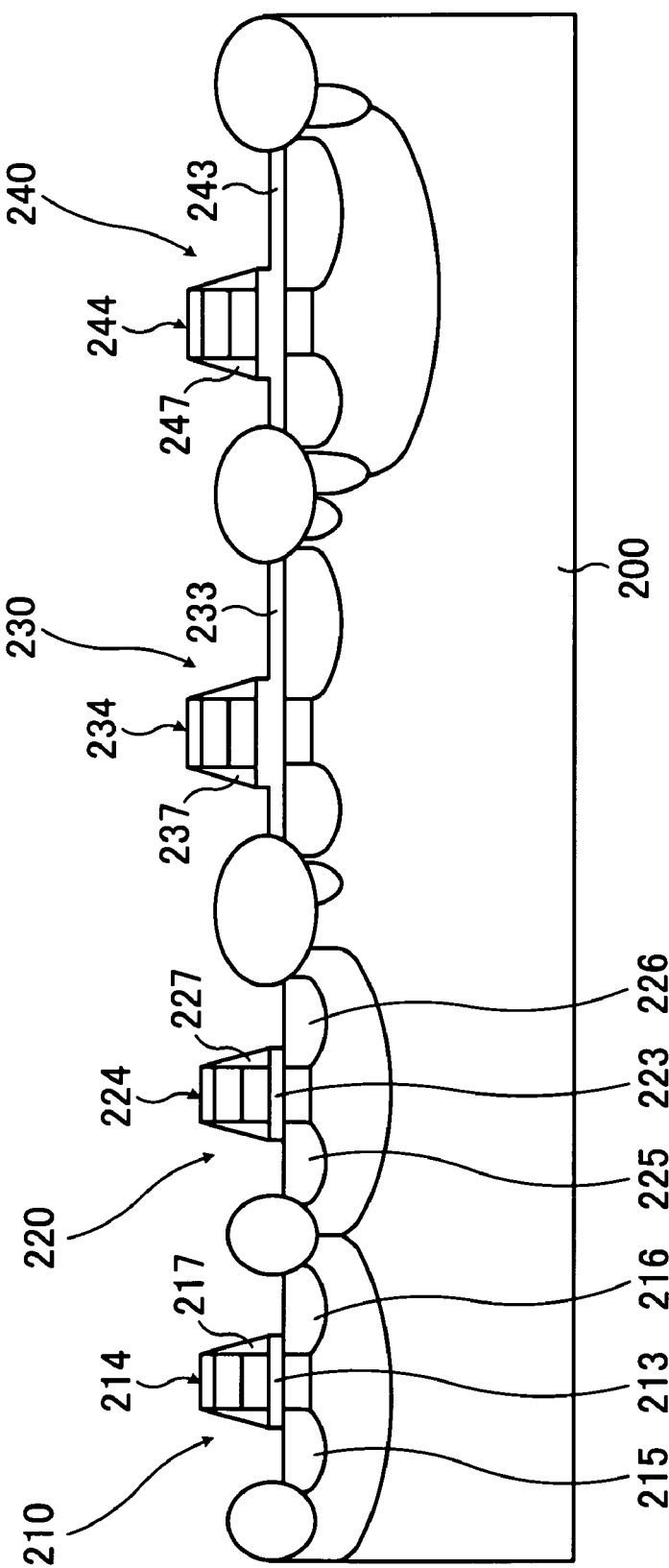
FIG. 33 is a schematic sectional view showing an important part of another example of a sidewall formation process.
Figure 34:
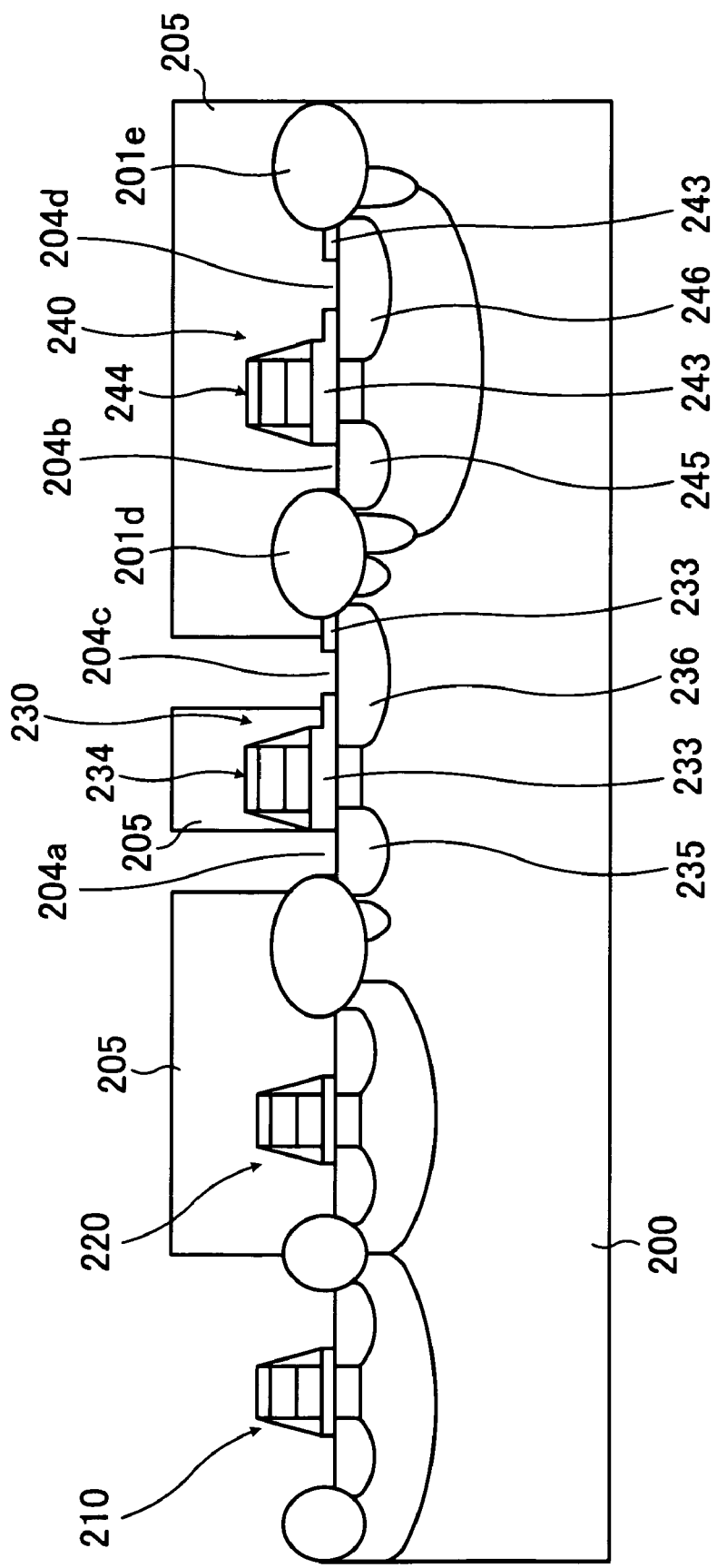
FIG. 34 is a schematic sectional view showing an important part of an example of a high impurity concentration region formation process.

FIG. 31 is a schematic sectional view showing an important part of a contact and wiring formation process.

After the interlayer dielectric film 101 is formed, a resist pattern for forming contact holes is formed first. The interlayer dielectric film 101 is etched with the resist pattern as a mask. By doing so, contact holes which reach the silicide layers 49b, 59b, 69a, 69b, 79a, and 79b are formed. Tungsten, for example, is then embedded in these contact holes to form plugs 102a, 102b, 102c, 102d, 102e, and 102f.

An aluminum film with a thickness of about 500 nm is then formed as a wiring material by, for example, the sputtering method. A resist pattern is formed and the aluminum film is etched with the resist pattern as a mask. By doing so, wirings 103a, 103b, 103c, 103d, 103e, and 103f connected to the plugs 102a, 102b, 102c, 102d, 102e, and 102f, respectively, are formed.

By performing the above processes, the semiconductor device in which the n-channel logic transistor, the p-channel logic transistor, the n-channel high-breakdown-voltage transistor, and the p-channel high-breakdown-voltage transistor are formed on the one Si substrate is fabricated.

By adopting the above fabrication method, each of the sidewalls 46 and 56 of the logic transistors formed has a proper shape. In the high-breakdown-voltage transistors, the high concentration drain regions 68b and 78b can be formed on a self align basis with respect to the low concentration drain regions 65b and 75b respectively. The silicide layers 69b and 79b can also be formed on a self align basis with respect to the low concentration drain regions 65b and 75b respectively. In addition, the high concentration drain regions 68b and 78b of the high-breakdown-voltage transistors are involved in the low concentration drain regions 65b and 75b respectively. The high concentration drain region 68b and the silicide layer 69b formed thereon are separate from the isolation region 84d. Similarly, the high concentration drain region 78b and the silicide layer 79b formed thereon are separate from the isolation region 84e. As a result, the breakdown voltage of the high-breakdown-voltage transistors can be secured sufficiently. Therefore, a high-performance high-quality semiconductor device the characteristics of which are superior and variation in the characteristics of which is suppressed can be realized.

In the present invention, an insulating film which has an opening region and which is thick around the opening region is formed on at least one of the low impurity concentration regions formed in the semiconductor substrate on both sides of the gate electrode. As a result, if the high impurity concentration region is formed in the low impurity concentration region beneath the opening region, the insulating film around the opening region can prevent impurities from passing through and variation in the concentration of impurities in the high impurity concentration region or in a position where the high impurity concentration region is formed can be suppressed. Therefore, a high-performance high-quality semiconductor device the characteristics of which are superior and variation in the characteristics of which is suppressed can be realized.

In particular, if a semiconductor device includes logic transistors and high-breakdown-voltage transistors formed on one substrate, each of the high-breakdown-voltage transistors should have the above structure. This suppresses variation or a drop in breakdown voltage and sufficiently secures breakdown voltage.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device, comprising:
   an isolation region formed in a semiconductor substrate;
   a gate electrode formed over an element region of the semiconductor substrate defined by the isolation region with a gate insulating film between, the gate electrode having a sidewall on its sides;
   low impurity concentration regions formed in the element region of the semiconductor substrate on both sides of the gate electrode;
   an insulating film which is formed over at least one of the low impurity concentration regions, which has an opening region;
   a high impurity concentration region formed in said low impurity concentration region beneath the opening region; and
   an interlayer dielectric film formed over the semiconductor substrate; wherein
   the gate insulating film is provided beneath the gate electrode and the sidewall, and is extended and provided over said low impurity concentration region and reaches the isolation region on a side of said low impurity concentration region;
   the insulating film includes the gate insulating film as a lower portion of the insulating film;
   the opening region of the insulating film is provided in a region separated from both the sidewall and the isolation region and penetrates through the gate insulating film; and
   the insulating film has a thick portion surrounding the opening region, and is covered with the interlayer dielectric film.

2. The semiconductor device according to claim 1, wherein the thick portion has a two-layer structure including a film made of a material of which the sidewall is made and the gate insulating film.

3. The semiconductor device according to claim 1, wherein a silicide layer is formed on the high impurity concentration region beneath the opening region.

4. The semiconductor device according to claim 1, wherein the thick portion is formed on any one of a source region and a drain region in the low impurity concentration region, a higher voltage being applied to the one of the source region and the drain region.

5. The semiconductor device according to claim 1, further comprising:
   a first area where a logic transistor is formed; and
   a second area where a high-breakdown-voltage transistor is formed,
   wherein the second area includes the thick portion.

* * * * *